(12) United States Patent
Kawahito

(10) Patent No.: US 8,553,112 B2
(45) Date of Patent: Oct. 8, 2013

(54) A/D CONVERTER AND READOUT CIRCUIT

(75) Inventor: Shoji Kawahito, Hamamatsu (JP)

(73) Assignee: National University Corporation Shizuoka University (JP)

( * ) Notice: Subject to any disclaimer, the term of this patent is extended or adjusted under 35 U.S.C. 154(b) by 893 days.

(21) Appl. No.: 12/375,879

(22) PCT Filed: Jul. 31, 2007

(86) PCT No.: PCT/JP2007/064986
§ 371 (c)(1),
(2), (4) Date: Jul. 21, 2009

(87) PCT Pub. No.: WO2008/016049
PCT Pub. Date: Feb. 7, 2008

(65) Prior Publication Data
US 2009/0303358 A1    Dec. 10, 2009

(30) Foreign Application Priority Data

Jul. 31, 2006 (JP) ................ P2006-208664

(51) Int. Cl.
*H04N 5/20* (2006.01)
*H04N 5/217* (2011.01)
(52) U.S. Cl.
USPC .......................... 348/255; 348/241
(58) Field of Classification Search
USPC ............. 348/229.1, 241, 255, 294, 300–302, 348/308–310; 341/122, 150, 172; 250/208.1
See application file for complete search history.

(56) References Cited

U.S. PATENT DOCUMENTS 4,355,335 A    10/1982    Imaide et al.
(Continued)

FOREIGN PATENT DOCUMENTS

DE    37 19 967 A1    12/1987
EP    1679798 A1 *  7/2006
(Continued)

OTHER PUBLICATIONS

European Search Report issued on Aug. 1, 2011 in connection with corresponding European Patent Application No. 07791671.6.
English translation of International Preliminary Report on Patentability.
(Continued)

*Primary Examiner* — Roberto Velez
*Assistant Examiner* — Carramah J Quiett
(74) *Attorney, Agent, or Firm* — Ostrolenk Faber LLP

(57) ABSTRACT

An A/D converter 11 performs multiple-times sampling on a first signal S1 in a first period T1 while performing multiple-times sampling on a second signal S2 in a second period T2. An A/D converter circuit 17 provides a digital signal in response to a signal from an output 15b of a gain stage 15 in the second period T2. The digital signal may have a value "1" or a value "0". The A/D converter circuit 17 includes a circuit 18 providing a signal $S_{A/DM}$ corresponding to the number of times the value "1" appears. A switch 24 operates in response to a clock signal φs and is used to sample a signal from a pixel 2a. In a first capacitor circuit 27, a switch 29 and a capacitor 31 are connected to an inverting input 23a and a non-inverting output 23b, respectively. The switch 29 operates in response to a clock signal φ3 and is used for integration in the capacitor 31.

14 Claims, 16 Drawing Sheets

(56) References Cited

U.S. PATENT DOCUMENTS

| | | | |
|---|---|---|---|
| 4,809,074 A | | 2/1989 | Imaide et al. |
| 6,166,367 A | * | 12/2000 | Cho ............................ 250/208.1 |
| 6,529,237 B1 | * | 3/2003 | Tsay et al. ..................... 348/241 |
| 6,885,396 B1 | * | 4/2005 | Panicacci et al. .............. 348/241 |
| 7,821,555 B2 | * | 10/2010 | Rossi ............................ 348/300 |
| 2007/0080842 A1 | | 4/2007 | Kawahito |

FOREIGN PATENT DOCUMENTS

| | | |
|---|---|---|
| JP | 3-225284 | 10/1991 |
| JP | 2005-136540 | 5/2005 |
| JP | 2005-269471 | 9/2005 |
| JP | 2006-25189 | 1/2006 |

OTHER PUBLICATIONS

International Search Report issued Sep. 11, 2007.
Sakakibara, M., et al., "A High-Sensitivity CMOS Image Sensor With Gain-Adaptive Column Amplifiers," IEEE Journal of Solid-State Circuits, vol. 40, No. 5, pp. 1147-1156 (May 2005).
Kawai, N., et al., "Noise Analysis of High-Gain, Low-Noise Column Readout Circuits for CMOS Image Sensors," IEEE Transactions on Electron Devices, vol. 51, No. 2, pp. 185-194 (Feb. 2004).
Krymski, A., et al., "A 2e Noise 1.3Megapixel CMOS Sensor," Proc. IEEE workshop CCD and Advanced Image Sensors, Elmau, Germany.

* cited by examiner (a)

(b)

(a)

(b)

(c)

(d)

(e)

(f)

(g)

A/D CONVERTER AND READOUT CIRCUIT

TECHNICAL FIELD

The present invention relates to an A/D converter and a readout circuit for a CMOS image sensor.

BACKGROUND

A circuit disclosed in Non-patent Document 1 reduces the effect of noise on a signal by amplifying a signal from a column using a high-gain amplifier connected to the column. An amplifier of a circuit disclosed in Non-patent Document 2 has two amplification factors of one and eight to satisfy both a reduction in noise and a wide dynamic range. A circuit disclosed in Non-patent Document 3 provides low-noise signal readout. In this readout, the peripheral circuits of an image sensor include a two-step noise-canceling circuit including a high-gain amplifier.

Patent Document 1 discloses an A/D converter array and an image sensor. The A/D converter array and the image sensor generate a signal of the difference between the signal level and the reset level and amplify this difference signal by n times using three capacitors. Patent Document 2 discloses an image sensor having a digital noise-canceling function. Such an image sensor generates digital values through A/D conversion on the signal level and the reset level of an image array and then determines the difference therebetween, without a noise canceling column circuit for.

Non-patent Document 1: A. Krymski, N. Khaliullin, H Krymski, N. Khaliullin, H. Rhodes, "A 2e noise 1.3 Megapixel CMOS sensor," Proc. IEEE workshop CCD and Advanced Image Sensors, Elmau, Germany.

Non-patent Document 2: M. Sakakibara, S. Kawahito, D. Handoko, N. Nakamura, H. Satoh, M. Higashi, K. Mabuchi, H. Sumi, "A high-sensitivity CMOS image sensor with gain-adaptive column amplifiers," IEEE J. Solid-State Circuits, vol. 40, no. 5, pp. 1147-1156, 2005.

Non-patent Document 3: N. Kawai, S. Kawahito, "Noise analysis of high-gain low-noise column readout circuits for CMOS image sensors", IEEE Trans. Electron Devices, vol. 51, no. 2, pp. 185-194 (2004).

Patent Document 1: Japanese Unexamined Patent Application Publication No. 2005-136540

Patent Document 2: Japanese Unexamined Patent Application Publication No. 2006-25189

DISCLOSURE OF THE INVENTION

Problems to be Solved by the Invention

The latest advancement in the image quality of CMOS image sensors is significant. A CMOS image sensor includes a peripheral circuit connected to a column. The peripheral circuit reduces noise using a readout circuit having an amplification function. The use of the peripheral circuit, therefore, can provide a significantly low-noise image sensor. The documents mentioned above describe noise reduction by amplification using a column processing circuit.

However, the dynamic range of a signal is not obtained through simple amplification such as that performed by the circuit in Non-patent Document 1. As a result, this simple amplification cannot achieve both high-sensitivity/low-noise and a large dynamic range. Since the amplifier of the circuit in Non-patent Document 2 has only two gain levels, it cannot always generate a required gradation for A/D conversion. Non-patent Document 3 describes the possibility of significantly low noise by high gain of an amplifier. However, this procedure is also a simple amplification, and thus cannot ensure both high sensitivity/low noise performance and a wide dynamic range performance.

It is an object of the present invention to provide an A/D converter and a readout circuit which are capable of performing noise cancellation to signals from pixels of a CMOS image sensor.

Means of Solving the Problems

An aspect of the present invention is an A/D converter for an image sensor. The A/D converter comprises: (a) a gain stage having an output and an input for receiving a signal from the image sensor, the gain stage performing multiple-times sampling of a first signal from a pixel of the image sensor and integration of sampled values in a first period while performing multiple-times sampling of a second signal from the pixel and integration of sampled values in a second period with reversed polarity relative to the integration of the first signal, the first signal containing a component associated with noise, the second signal containing a photo-induced signal component and the component associated with noise, the gain stage including a first capacitor for the sampling, a second capacitor for the integration, and an operational amplifier circuit for performing sampling of a signal in the first capacitor and integration of the sampled signal by use of the second capacitor; (b) an A/D converter circuit providing a digital signal, the digital signal having one of first and second values in accordance with a signal from the output of the gain stage; (c) a circuit providing a signal, the signal representing the number of times the first value appears; (d) a logic circuit generating a control signal in response to the digital signal; and (e) a D/A converter circuit providing a predetermined voltage signal to the gain stage in the first period while providing a voltage signal to the gain stage in the second period, the voltage signal corresponding to the control signal.

Another aspect of the present invention is an A/D converter for an image sensor. This A/D converter comprises: (a) a gain stage having an output and an input for receiving a signal from the image sensor, the gain stage performing multiple-times sampling of a first signal from a pixel of the image sensor and integration of sampled values in a first period while performing multiple-times sampling of a second signal from the pixel and integration of sampled values in a second period with reversed polarity relative to the integration of the first signal, the first signal containing a component associated with noise, the second signal containing a photo-induced signal component and the component associated with noise; (b) an A/D converter circuit providing a digital signal, the digital signal having one of first and second values in accordance with a signal from the output of the gain stage; (c) a circuit providing a signal, the signal representing the number of times the first value appears; (d) a logic circuit generating a control signal in response to the digital signal; and (e) a D/A converter circuit providing a predetermined voltage signal to the gain stage in the first period while providing a voltage signal to the gain stage in the second period, the voltage signal corresponding to the control signal. The gain stage further comprises (a1) an operational amplifier circuit, a first capacitor having a first end connected to the D/A converter circuit, and a second end connected to an inverting input of the operational amplifier circuit, (a2) a first switch, connected between the input and the first end of the first capacitor, which samples the signal from the image signal, (a3) a first capacitor circuit, connected between a non-inverting output and the inverting input of the operational amplifier circuit, which has a second capacitor and a second switch which are connected in series, and (a4) a first feedback switch connected between the inverting input and the non-inverting output.

This A/D converter performs multiple-times sampling and integration of the first signal containing the component associated with noise in the first period, and performs multiple-times sampling and integration of the second signal containing a photo-induced signal from a pixel and components associated with noise in the second period, and the polarity of the latter integration is reversed relative to that of the first signal. An electric charge accumulated in the first capacitor circuit therefore represents an integrated value which is associated with the difference between the first signal and the second signal. This difference corresponds to the photo-induced signal component of the pixel. The signal component is multiplied by N(N corresponds to the number of times integration is performed) through the multiple-times integration, whereas the random noise component is multiplied by sqrt (N) ("sqrt" means mathematical operation of square root) through the multiple-times integration. The multiple-times integration therefore improves the S/N ratio by sqrt (N). The A/D converter circuit provides a signal indicating the number of times the first value appears in the first value and second value of the digital signal generated from the signal from the output of the gain stage. The number of appearance times corresponds to the upper significant bits of the A/D conversion value generated by the A/D converter circuit in response to an input.

In the A/D converter according to the present invention, it is preferred that the gain stage perform cyclic A/D conversion in a third period after the first and second periods by use of the voltage signal provided by the D/A converter circuit in accordance with the signal from the output of the gain stage.

In the A/D converter according to the present invention, the A/D converter circuit includes a comparator, the comparator compares the signal from the output of the gain stage with a first reference signal and a second reference signal, the comparator receives the first reference signal during the second period, and the comparator receives the second reference signal in the third period. In this A/D converter, it is preferred that a value of the second reference signal be smaller than a value of the first reference signal.

In the A/D converter according to the present invention, the first capacitor receives the first and second signals for the sampling. The gain stage integrates the first signal in the second capacitor by use of the operational amplifier circuit in response to one of providing a signal from the D/A converter circuit and sampling in the first capacitor, and the gain stage integrates the second signal in the second capacitor by use of the operational amplifier circuit in response to another of providing a signal from the D/A converter circuit and sampling in the first capacitor.

In the A/D converter according to the present invention, the gain stage further comprises a third capacitor for the sampling and a fourth capacitor for the integration. One of the first capacitor and the third capacitor receives the first signal for the sampling to provide a first sampled signal, and another of the first capacitor and the third capacitor receives the second signal for the sampling to provide a second sampled signal. The operational amplifier circuit integrates the first and second sampled signals into the second capacitor and the fourth capacitor in response to the signal from the D/A converter circuit, respectively.

In the A/D converter according to the present invention, the pixel is a CMOS image sensor pixel prepared for a CMOS image sensor. The CMOS image sensor pixel provides the first signal when a floating diffusion layer of the CMOS image sensor pixel is in a reset state, and the CMOS image sensor pixel provides the second signal when the floating diffusion layer is in a photo-induced-electric-charge accumulation state provided after the reset state.

According to this A/D converter, the first signal from the pixel is sampled by the first capacitor in a sampling period of the first period when the floating diffusion layer of the pixel is in a rest state. The sampled signal is transferred to the second capacitor of the first capacitor circuit in an integration period of the first period in response to a predetermined voltage signal from the D/A converter circuit. During the first period, the sampling and the integration are repeated alternately. The electric charge accumulated in the second capacitor represents the integration value, which are produced by multiple-times integration of the first signals. When the floating diffusion layer of the pixel is in a photo-induced-electric-charge accumulation state after the reset state, sampling of the second signal from the pixel is performed by the first capacitor in a sampling period of the second period, and then the sampled signal is transferred to the second capacitor of the first capacitor circuit. The sampling of the first capacitor is performed in a reference-voltage sampling period of the second period in response to the voltage signal from the D/A converter circuit. In the second period, the sampling of the pixel signal and the transfer of the signal to the second capacitor are performed simultaneously. As a result of performing integration with reversed polarity relative to the integration during the first period, the electric charge accumulated in the first capacitor circuit represent an integration value associated with the difference between the first signal and the second signal. This difference corresponds to a signal component of the pixel. The signal component is multiplied by N through multiple-times integration, whereas the random noise component is accumulated by sqrt (N). The A/D converter circuit provides a signal that represents the number of times the first value appears in the first and second values of the digital signal, which corresponds to a signal from the output of the gain stage. This number of appearance times corresponds to the upper significant bit(s) in the A/D converted value generated by the A/D converter circuit in response to an input.

In the A/D converter according to the present invention, the gain stage performs cyclic A/D conversion in a third period after the first and second periods, and the A/D converter circuit receives the signal from the output of the gain stage and generates a ternary digital signal in the third period. The gain stage may further comprise another feedback switch connected between the first end of the first capacitor and the non-inverting output, and a transfer switch connected between the second end of the first capacitor and the inverting input.

This A/D converter performs cyclic A/D conversion of the electric charge accumulated in the first capacitor circuit after the second period elapses. The electric charge is sampled in the first capacitor via the other feedback switch in the sampling period of the third period. The electric charge is rearranged through applying a voltage signal from the D/A converter circuit to the first capacitor in a transfer period of the third period, thereby generating a new voltage value at the output of the gain stage. In response to the voltage value, the A/D converter circuit generates digital signal for the current cycle.

The A/D converter according to the present invention may have a fully differential structure. The A/D converter according to the present invention having a fully differential structure can perform cyclic A/D conversion in the third period after the first and second periods.

In the A/D converter according to the present invention, the first end of the second capacitor is connected to the inverting input and the second switch is connected between the second end of the second capacitor and the non-inverting output in the first capacitor circuit; and it is preferred that the first capacitor circuit comprise a fifth capacitor connected to a first node that is connected to the second end of the second capacitor and the second switch. This A/D converter can reduce the voltage dependency of noise caused due to switching of the second switch (for example, charge injection noise in a MOS analog switch which can be used as the second switch).

In the A/D converter according to the present invention, the first end of the fourth capacitor is connected to the inverting input and the fourth switch is connected to a second node that is connected to the second end of the fourth capacitor and the inverting output in the second capacitor circuit; and the second capacitor circuit may comprise a sixth capacitor connected to a second node that is connected to the second end of the fourth capacitor and the fourth switch. This A/D converter can reduce the voltage dependency of noise due to the switching of the fourth switch (for example, charge injection noise in a MOS analog switch which can be used as the fourth switch).

The A/D converter according to the present invention may further comprise a preamplifier connected between a pixel of the image sensor and the input of the gain stage. The preamplifier provides the first signal and the second signal, and the preamplifier includes an operational amplifier circuit, a first capacitor connected to an input of the operational amplifier circuit, a second capacitor connected between an output of the operational amplifier circuit and the input, and a switch connected between the output and the input. The preamplifier amplifies the first and second signals, and the gain of the preamplifier is defined as a capacitance ratio of the first capacitor and the second capacitor of the preamplifier. The first signal contains a component associated with noise of the preamplifier, and the second signal contains a difference component in addition to the components associated with noise of the preamplifier. The difference component indicates a difference between a signal provided from the pixel in the reset state and a signal provided from the pixel in the photo-induced-electric-charge accumulation state after the reset state.

Another aspect of the present invention is a readout circuit for an image sensor. The image sensor includes a pixel. The pixel generates a first signal and a second signal. The first signal is generated when a floating diffusion layer of the pixel is in a reset state, and the second signal is generated when the floating diffusion layer of the pixel is in a photo-induced-electric-charge accumulation state. The readout circuit comprising: a preamplifier including an operational amplifier circuit, a first capacitor connected to an input of the operational amplifier circuit, and a second capacitor connected between the input and an output of the operational amplifier circuit, the preamplifier amplifying the first signal and the second signal, and a gain of the preamplifier is defined as a capacitance ratio of the first capacitor and the second capacitor of the preamplifier; and an integrator including a sampling switch connected to an output of the preamplifier, the integrator amplifying a difference component by performing multiple-times integration of the amplified first signal by use of the sampling switch while performing multiple-times integration of the amplified second signal by use of the sampling switch, the difference component indicating a difference between the first signal and the second signal, and the integration of the amplified second signal being performed with reversed polarity relative to that of the integration of the amplified first signal.

This readout circuit performs multiple-times integration of the amplified first signal, and performs multiple-times integration of the amplified second signal such that the output of the preamplifier has reversed polarity. Therefore, the integrator provides an amplified difference signal between the first signal and the second signal.

The A/D converter according to the present invention further comprises a readout circuit. The readout circuit is connected between a pixel of a CMOS image sensor and an input of a gain stage.

The object, other objects, features, and advantages of the present invention are clearly demonstrated through the following detailed descriptions of the preferred embodiments of the present invention with reference to the accompanying drawings.

Advantages of the Invention

As described above, according to the present invention, an A/D converter and a readout circuit capable of performing noise cancellation on signals from pixels of a CMOS image sensor.

EXPLANATION OF REFERENCE NUMERALS

Figure 1:
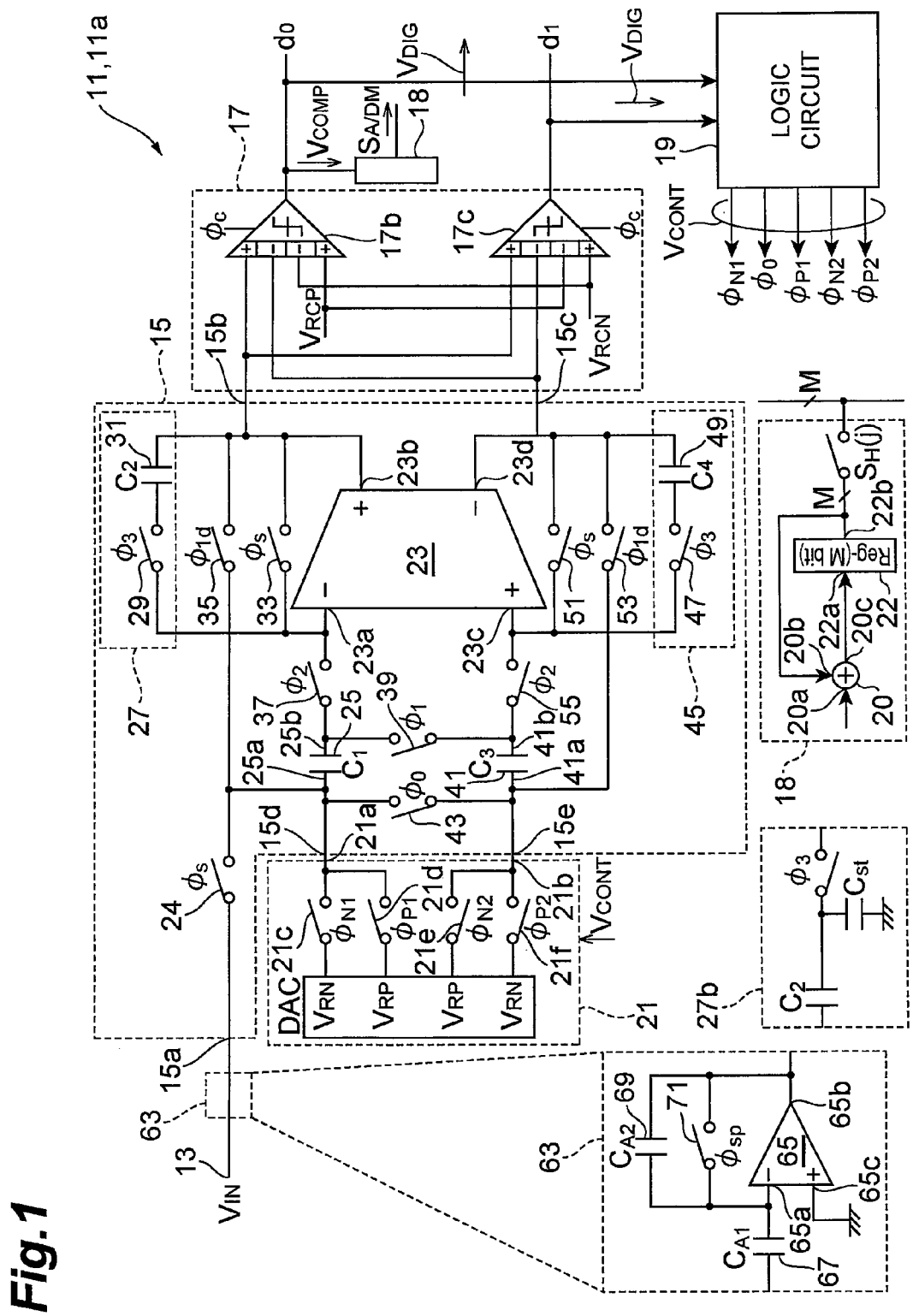
FIG. 1 is a circuit diagram of an A/D converter according to this embodiment.

1: CMOS image sensor, 2: cell array, 2a: CMOS image sensor pixel, 11, 11a, 11b: A/D converter, 15: gain stage, 17: A/D converter circuit, 18: circuit for providing a signal $S_{A/DM}$, 19: logic circuit, 21: D/A converter circuit, 23: operational amplifier circuit, 25, 31, 41, 49: capacitor, 24, 29, 33, 43, 47, 51, 53, 55, 59: switch, 27, 27b, 45: capacitor circuit, 63: preamplifier, 65: operational amplifier circuit 67, 69: capacitor, 71: switch, 81: readout circuit, 83: preamplifier 85: integrator, 87: operational amplifier circuit, 89, 91: capacitor, 95: switch, 97: sampling switch, 89, 103, 109: capacitor, 101: capacitor circuit, 105, 107, 111, 112: switch

BEST MODE FOR CARRYING OUT THE INVENTION

The teaching of the present invention can be easily understood through consideration of the following detailed descriptions with reference to the accompanying drawings illustrated as examples. In the following, A/D converters and readout circuits according to embodiments of the prevent invention will be described with reference to the accompanying drawings. When possible, the same components are referred to as the same reference numerals.

First Embodiment

Figure 2:
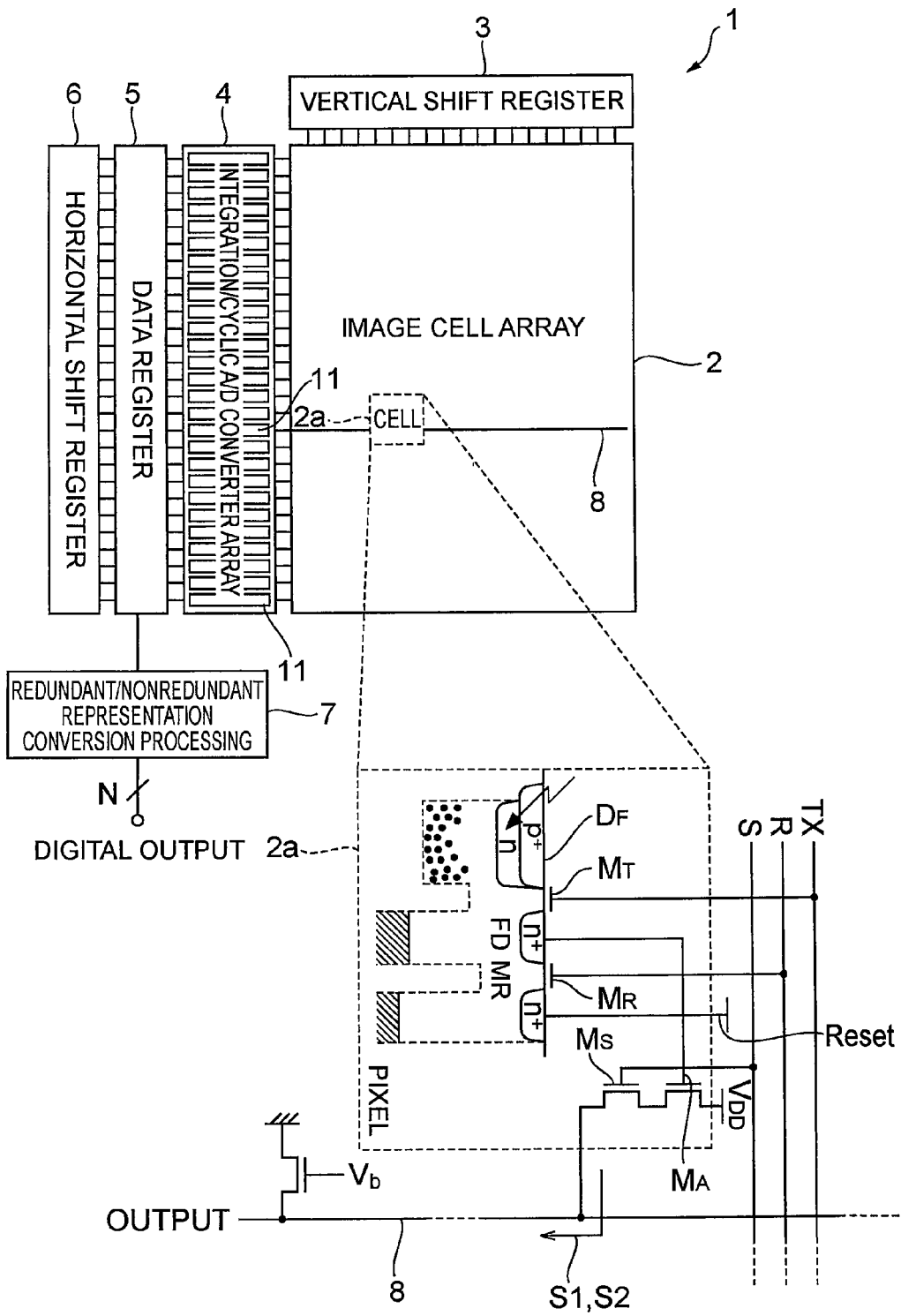
FIG. 2 is a drawing illustrating a block of a CMOS image sensor.

FIG. 1 is a circuit diagram of an A/D converter according to this embodiment. In this embodiment, an A/D converter 11 is used for a CMOS image sensor. FIG. 2 is a drawing illustrating a block of the CMOS image sensor. The A/D converters 11 is used in the CMOS image sensor 1. The CMOS image sensor 1 includes CMOS image sensor pixels 2a that are arranged in the column direction and the row direction to form a cell array 2. FIG. 2 illustrates an exemplary CMOS image sensor pixel 2a. The pixel 2a generates a first signal S1 in a reset state and a second signal S2 in a photo-induced signal output state. An input 13 of the A/D converter 11 is connected to the pixel 2a. At the A/D converter 11, the input 15a of a gain stage 15 receives a signal from the pixel 2a. The A/D converter 11 carries out multiple-times sampling of the first signal S1 during a first period T1, and integrates the sampled values while carrying out multiple-times sampling of the second signal S2 during a second period T2, and integrates the sampled values. An A/D converter circuit 17 provides a digital signal that corresponds to a signal from the output 15b of the gain stage 15 during the second period T2. This digital signal may have a first value or a second value (for example, "1" or "0"). The A/D converter circuit 17 can include comparators 17b and 17c for 1.5-bit A/D conversion. A circuit 18 is connected to an output of the A/D converter circuit 17 (for example, an output of the comparator 17b) and provides a signal $S_{A/DM}$ representing the number of the times the first value appears. A logic circuit 19 generates control signals during the first period T1 and the second period T2 in response to signals from the A/D converter circuit 17. A D/A converter circuit 21 provides a predetermined voltage signal to the gain stage 15 during the first period T1 in response to a control signal $V_{CONT}$ while providing a voltage signal to the gain stage 15 during the second period T2 in response to the control signal $V_{CONT}$. The gain stage 15 includes an operational amplifier circuit 23. A first end 25a of a first capacitor 25 is connected to an output 21a of the D/A converter circuit 21, while a second end 25b of the first capacitor 25 is connected to an inverting input 23a of the operational amplifier circuit 23. A first switch 24 is connected between the input 13 and the capacitor first end 25a. The first switch 24 operates in response to a clock signal φs and is used for sampling signals from the pixel 2a. A first capacitance circuit 27 is connected between the inverting input 23a and a non-inverting output 23b. In the first capacitance circuit 27, a second switch 29 and a second capacitor 31 are connected in series between the inverting input 23a and the non-inverting output 23b. The second switch 29 operates in response to a clock signal φ3 and is used for integration in the second capacitor 31. For example, the first capacitance circuit 27 may be replaced with a first capacitance circuit 27b. A first feedback switch 33 is connected between the inverting input and the non-inverting output.

With reference to FIG. 2, in the CMOS image sensor 1, a vertical shift register 3 is connected to the columns of the cell array 2, and an A/D converter array 4 is connected to the rows of the cell array 2. The A/D converter array 4 includes a plurality of A/D converters arranged in an array. Each A/D converter is depicted as an A/D converter 11. A data register 5 is connected to the A/D converter array 4. A/D-converted values corresponding to signals from the pixel 2a are stored in the data register 5. In response to a signal from a horizontal shift register 6, the data register 5 provides a digital signal to a redundant/non-redundant-representation converting circuit 7. The redundant/non-redundant-representation converter circuit 7 generates an N-bit digital code corresponding to the signal from pixel 2a.

A photodiode $D_F$ of the pixel 2a receives light illuminating to one pixel, and the light is associated with an image. The gate of a selection transistor $M_S$ is connected to a row-selection line S extending in the row direction. The gate of a reset transistor $M_R$ is connected to a reset line R. The gate of a transfer transistor $M_T$ is connected to a transfer-selection line extending in the row direction. A first end of the photodiode $D_F$ is connected to a floating diffusion layer FD via the transfer transistor $M_T$. The floating diffusion layer FD is connected to a reset potential line Reset via the reset transistor $M_R$ and also is connected to a transistor $M_A$. A current terminal (for example, drain) of the transistor $M_A$ is connected to a row line 8 via the selection transistor $M_S$. The transistor $M_A$ provides an electric potential to the row line via the selection transistor $M_S$ in response to the charge quantity of the floating diffusion layer FD.

In a pixel having the above structure, the noise cancellation operation is carried out as follows: First, a reset control signal R is supplied to the reset transistor $M_R$ so as to reset the floating diffusion layer FD. The reset level is read out via the amplification transistor $M_A$. Then, a charge-transfer control signal TX is supplied to the transfer transistor $M_T$ so as to transfer a photo-induced signal charge from the photodiode $D_F$ to the floating diffusion layer. Subsequently, the signal level is read out via the transistor $M_A$. The difference between the reset level and the signal level is produced by an integration/cyclic cascade A/D converter, such as that shown in FIG. 1. In this way, fixed pattern noise and the reset noise are cancelled out. The fixed pattern noise is caused due to variations in characteristics of the transistors of the pixel 2a, and the reset noise is generated when the floating diffusion layer has been reset.

Figure 3:
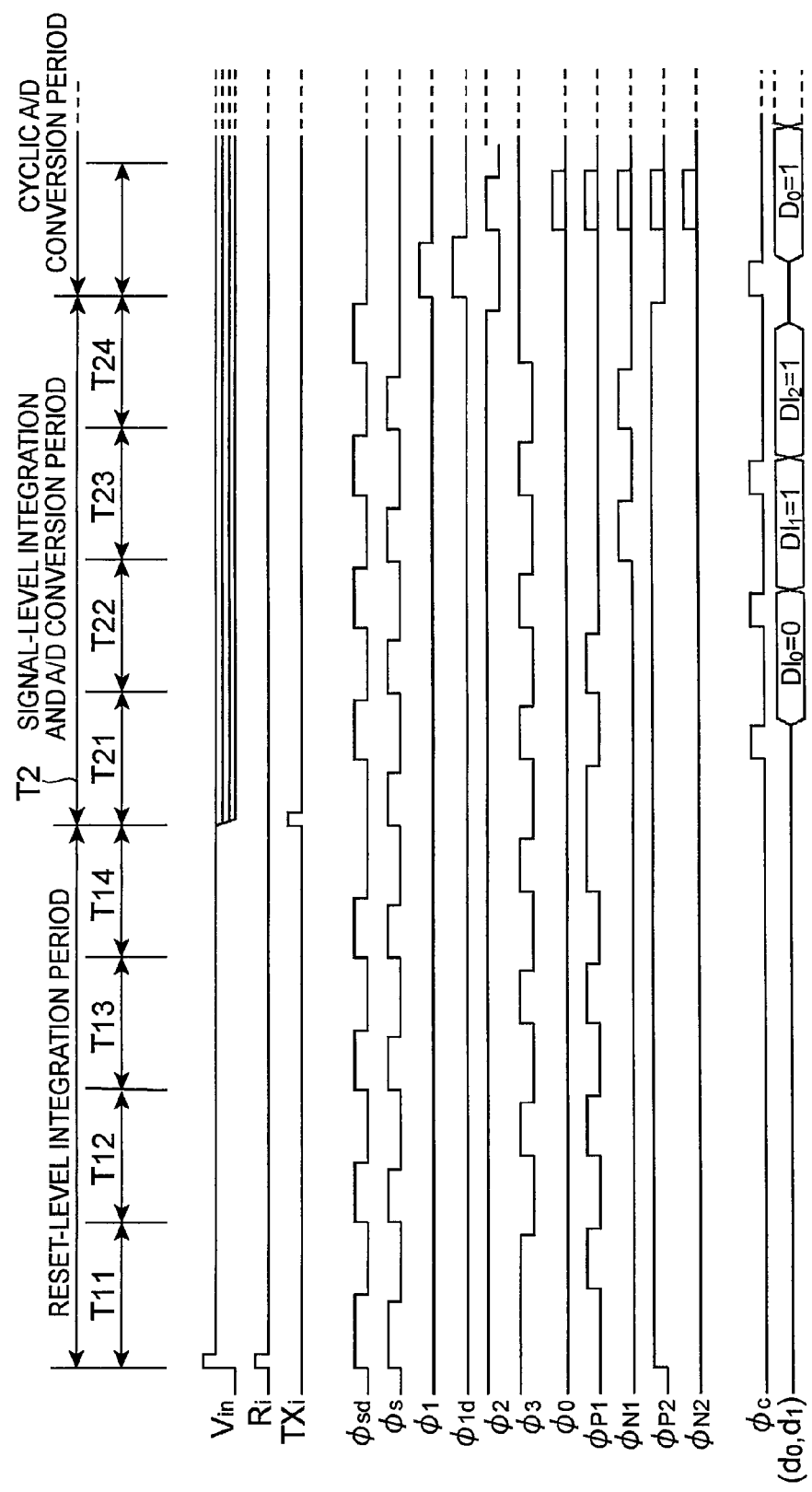
FIG. 3 is a drawing illustrating a timing chart for the operation of the A/D converter.
Figure 4:
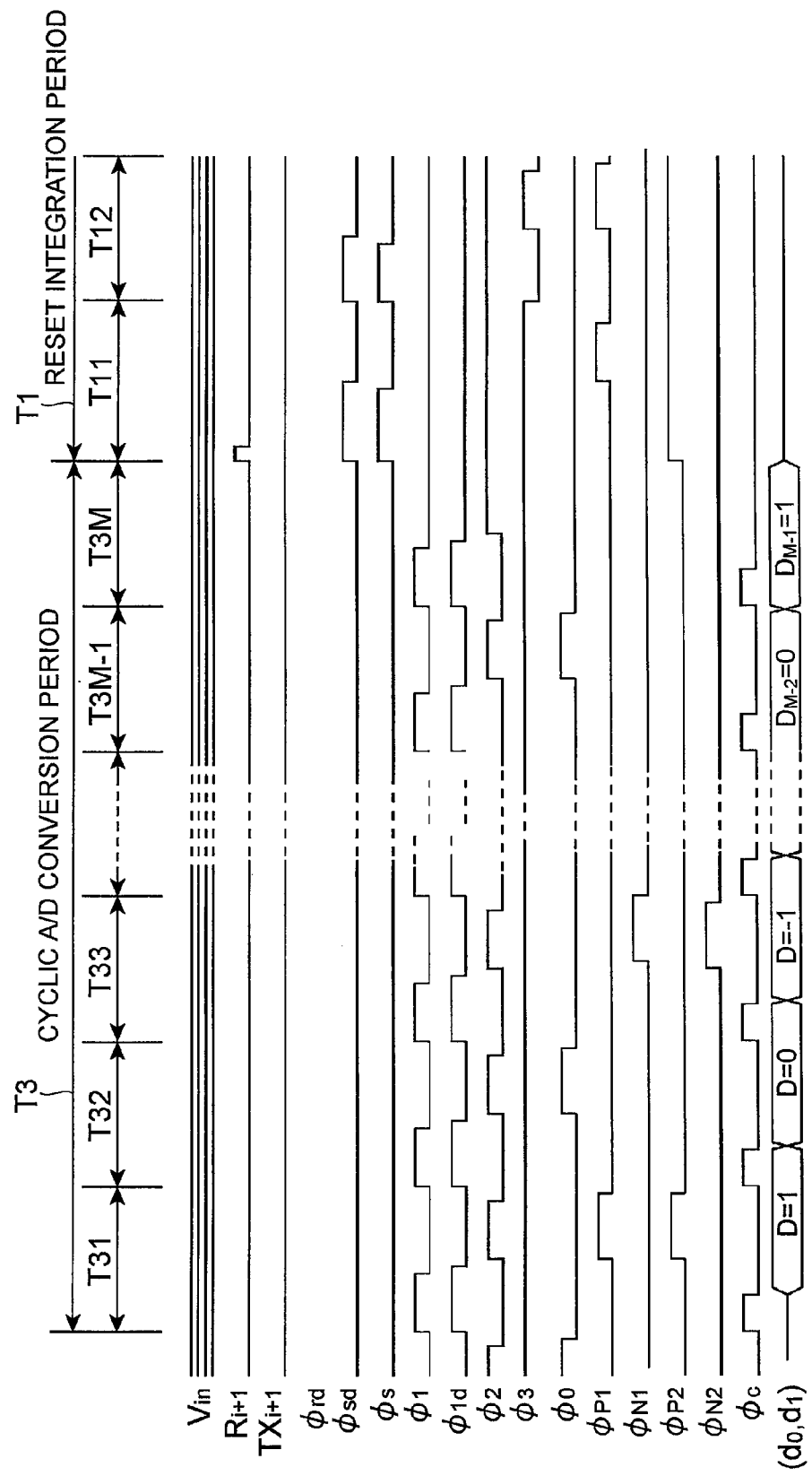
FIG. 4 is a drawing illustrating a timing chart for the operation of the A/D converter.

The subsequent noise cancellation operation will be described. FIGS. 3 and 4 are drawings illustrating timing charts showing the operation of an A/D converter. In order to facilitate the understanding of the operation of this A/D converter, an A/D converter will be described, which includes a single-ended operational amplifier circuit used as a gain stage.

The input of the A/D converter receives signals from a pixel in the image sensor array. This circuit carries out the noise cancellation of an image while carrying out the integration of signals for coarse A/D conversion (hereinafter, referred to as "integration A/D conversion"). This integration A/D conversion is carried out during the first and second periods T1 and T2. Then, the integration output is subjected to cyclic A/D conversion. In an embodiment of the integration A/D conversion shown in FIG. 2, the first signal S1 (for example, a signal indicating the reset level) is sampled during four periods T11, T12, T13, and T14 while the second signal S2 (for example, a signal indicating the photo-induced signal level) is sampled during four periods T21, T22, T23, and T24. Through this sampling, for example, 2-bit A/D conversion values are provided during the periods for integration A/D conversion. The number of sampling is for merely illustrative purposes and may be modified appropriately.

The A/D converter 11 carries out integration by multiple sampling for noise reduction and reduces random noise generated in the amplification transistor and the noise canceling circuit in a pixel. Upper significant bits are generated through the A/D conversion, thereby maintaining a required dynamic range.

The input 13 of the A/D converter 11 receives the first signal S1 (the value Vr of a reset level signal) of a pixel during an initial part of the period T11 in the first period T1. The switches 24 and 33 are turned on in response to the clock signal $\phi_S$ during a sampling period T11$_{SAM}$. This signal is sampled in the capacitor 25. The second switch 29 is turned on in response to the clock signal $\phi$3. The switches 24 and 33 are turned off while a switch 21d is turned on, in response to the clock signal $\phi$S during an integration period T11$_{INT}$, and the sampled signal is transferred to the second capacitor 31 via the switch 29 upon application of a predetermined voltage signal V$_{RP}$ from the D/A converter circuit 21 to the first capacitor 25.

For example, when the capacitance C1 of the first capacitor 25 is equal to the capacitance C2 of the second capacitor 31, V$_O$=(Vr-V$_{RP}$) is generated at the output 23b of the operational amplifier circuit 23. N times repetition of the sampling period and the integration period accumulates an electric charge in the capacitor circuit 27 of the gain stage 15, and generates V$_O$=N×(Vr-V$_{RP}$) at the output 23b of the operational amplifier circuit 23. The electric charge is stored in the capacitor circuit 27.

Because of integration in reverse polarity, a reference voltage V$_{RP}$ is sampled in the capacitor 25 through turning on the switch 21d in the D/A converter circuit 21 and the switch 33 in response to $\phi_{P1}$ of the control signal V$_{CONT}$ during an initial part T21$_{SAM}$ of the period T21 in the second period T2. Subsequently, the second signal S2 of the pixel (value Vs of a signal-level signal) is received at the input 13 of the A/D converter 11. This second signal S2 is sampled in the capacitor 25 through the turning-on of the switch 24 in response to the clock signal $\phi$s and the turning-on of the second switch 29 in response to the clock signal $\phi$3 in the sampling period T21$_{INT}$. An electric charge proportional to the difference between the reference voltage V$_{RP}$ and the received voltage Vs is transferred to the second capacitor 31 via the switch 29. In the first signal sampling, the D/A converter circuit 21 generates the voltage V$_{RP}$, independent of the operation of the A/D converter circuit 17.

As is apparent from this description, in the reverse-polarity integration in the A/D converter shown in FIG. 1, the polarity of the integration is made reversed depending on the sequence of received voltage signals. With normal polarity, an input signal for sampling is received at the first end of the first capacitor 25. After sampling the input signal in the first capacitor 25, the electric charge is transferred to the second capacitor 31 through switching the reference voltage to the first end of the first capacitor 25 (capacitance C1). In this way, electric charge "C1×((input signal)−(reference voltage))" is transferred to the second capacitor 31. With reverse polarity, the first end of the first capacitor 25 receives the reference voltage at first. After the reference voltage in the first capacitor 25 has been sampled, an electric charge is transferred to the second capacitor 31 through switching the input signal to the first end of the first capacitor 25. Electric charge "C1×((reference voltage)−(input signal))" is transferred to the second capacitor 31. Comparison of these equations shows that "C1×((reference voltage)" and "C1×((input signal)" appears in opposite orders. As will be described below, the selecting one of the normal polarity connection and the reversed polarity connection can be established by the switching of the input to the inverting input and to the non-inverting input.

The output of the gain stage 15 is provided to the comparator (the comparator 17b in the A/D converter circuit 17 in this embodiment). A reference voltage Vref1 for the integration A/D conversion is supplied to this comparator. The comparison result V$_{COMP}$ of the comparator is supplied to the logic circuit 19. The D/A converter circuit 21 operates in response to the control signal V$_{CONT}$ from the logic circuit 19. In the first signal sampling, however, the D/A converter circuit 21 provides the voltage V$_{RP}$, independent of the control signal V$_{CONT}$. The comparator operates as follows:

at V$_O$>Vref1, V$_{COMP}$=1, and the D/A converter circuit 21 provides V$_{RP}$ in the integration period;

at V$_O$≤Vref1, V$_{COMP}$=0, and the D/A converter circuit 21 provides V$_{RN}$ in the integration period.

Since an electric charge is accumulated in the capacitor circuit 27 in the gain stage 15 by N-times repetition of the sampling period and the integration period where N=N1+N2, V$_O$=N×(Vr−V$_{RP}$)+N1×(V$_{RP}$−Vs)+N2×(V$_{RN}$−Vs)=N×(Vr−Vs)−N2×(V$_{RP}$−V$_{RN}$) is generated at the output 23b of the operational amplifier circuit 23. The value N2 indicates the number of times "1" appears at the output of the comparator. In other words, the A/D converter circuit provides a signal in response to the number of times the first value in the digital signal of the first or second value appears, and the digital signal corresponds to a signal from the output of the gain stage. For example, the circuit 18 can count the occurrence of the value in this signal, and the circuit 18 is connected to the A/D converter circuit 17. The signal S$_{A/DM}$ is provided from the A/D converter circuit 17. This value corresponds to, for example, the most significant bit or the most significant bit and the subsequent significant bit(s) of the A/D converted value.

FIG. 1 illustrates an exemplary circuit 18. The circuit 18 includes an adder 20 having a first input 20a, a second input 20b and an output 20c; and a (M bit) register 22 having an input 22a and an output 22b. The first input 20a of the adder 20 receives a signal from the comparator 17b among the two comparators in the A/D converter circuit 17. The second input 20b of the adder 20 receives a signal from the output 22b of the register 22. The adder 20 provides the result (digital signal) of addition of the received signals to the M-bit register 22. During the integration A/D conversion, the register 22 holds the result of addition of the values "1" and "0" of the signal V$_{COMP}$ from the comparator 17b. The register 22 provides the signal S$_{A/DM}$ indicating the higher-digital bit(s) in the integration A/D conversion.

According to this A/D converter 11, the first signal S1 is sampled by the first capacitor 25 during a sampling period (for example, T11$_{SAM}$) in the first period T1. The sampled signal is transferred from the D/A converter circuit to the second capacitor 31 during an integration period (for example, period T11$_{INT}$) in the first period in response to a predetermined voltage signal. During the first period, sampling and integration are repeated alternately. The electric charge accumulated in the second capacitor 31 indicates the integral value, which are generated by use of multiple-times integration of the first signals S1. Sampling of the voltage signal from the D/A converter circuit 21 is performed by the first capacitor 25 during a sampling period (for example, period T21$_{SAM}$) in the second period T2. The sampled signal is transferred to the second capacitor 31 during an integration period (for example, T21$_{INT}$) in the second period T2 in response to the second signal S2. During the second period T2, the sampling and the integration is repeated alternately. The electric charge accumulated in the second capacitor 31 indicates an integratal value associated with the difference between the first signal S1 and the second signal S2. This difference represents a signal component of the pixel. The signal component is multiplied by N(N corresponds to the number of times integration is performed), whereas the random noise component is accumulated by sqrt (N) through multiple-times integration. The integration therefore improves the S/N ratio by sqrt (N).

With reference to FIG. 1 again, the A/D converter 11 will be further described. In order to carry out operation for cyclic A/D conversion by the gain stage 15 in the third period T3 after the first and second periods T1 and T2, the A/D converter circuit 17 provides a ternary digital signal V$_{DIG}$ (V$_{DIG}$ comprises (d0, d1)) corresponding to a signal from the output 15b of the gain stage 15 in a third period. In the gain stage 15, a feedback switch 35 is connected to between the capacitor first end 25a and the non-inverting output 15b, and operates in response to a clock signal φ1d. The second end 25b of the first capacitor 25 is connected to the inverting input 15a via the first capacitor circuit 27 via a transfer switch 37. The transfer switch 37 operates in response to a clock signal φ2. A switch 39 is connected to the capacitor second end 25b. The switch 39 operates in response to the clock signal φ1 and is connected, in the gain stage of a single end type, so as to provide a reference electric potential.

The A/D converter 11 performs cyclic A/D conversion during the third period T3 on the gain-stage output 15b generated by the electric charge accumulated in the first capacitor circuit during the second period. The electric charge is sampled in the first capacitor 25 via the second feedback switch 35 during a sampling period T31$_{SAM}$ in the third period. The electric charge is transferred from the first capacitor 25 to the second capacitor 31 via the transfer switch 37 through addition of the voltage signal from the D/A converter circuit 21 to the first capacitor 25 during a transfer period T31$_{TRF}$ in the third period T3. In this way, the electric charge is rearranged. As a result, a new voltage value is generated at the output 15b of the gain stage 15. The signal from the gain stage 15 is compared with the two reference voltages V$_{RCP}$ and V$_{RCN}$ in the D/A converter circuit 21. The reference voltages V$_{RCP}$ and V$_{RCN}$ are, for example, V$_{RP}$/4 and V$_{RN}$/4, respectively. The output of the A/D converter circuit 17 provides a redundant digital code. In response to this redundant digital code, the control circuit 19 generates a control signal V$_{CONT}$ for controlling the D/A converter circuit 21. The A/D converter circuit 17 generates a digital signal for this cycle. In the gain stage 15, a voltage sampled in the first capacitor 25 is amplified and the voltage signal from the D/A converter circuit 21 is subtracted therefrom in response to the voltage signal from the D/A converter circuit. Therefore, when C1=C2 is satisfied for the capacitances of the capacitors 25 and 31, the output of the gain stage 15 for the i-th cyclic operation is as follows:

$$V_O(i)=2 \times V_O(i-1)-V(i).$$

The output V(i) of the D/A converter circuit 21 is defined as:

$$V_{RP}(D(i)=+1);$$

$$0(D(i)=0); \text{ and}$$

$$V_{RN}(D(i)=-1).$$

The voltage V$_{PR}$ is a positive value, and thus, V$_{RN}$=−V$_{RP}$. Accordingly, the D/A converter circuit 21 includes a voltage source 21a providing the voltages V$_{RP}$ and V$_{RN}$ and switches 21c to 21f and 43 for switching the voltage value in response to the control signal V$_{CONT}$. The digital signal D(i) is defined as:

$$(D(i)=+1(V_{RP}/4<V_O(i-1));$$

$$(D(i)=0(V_{RN}/4<V_O(i-1) \leq V_{RP}/4); \text{ and}$$

$$(D(i)=-1(V_O(i-1) \leq V_{RN}/4).$$

The voltage range is defined by the comparators 17b and 17c of the A/D converter circuit 17. Acquisition of an A/D conversion value with a resolution of 12 bits through cyclic A/D conversion requires 11 cyclic operations.

Figure 5:
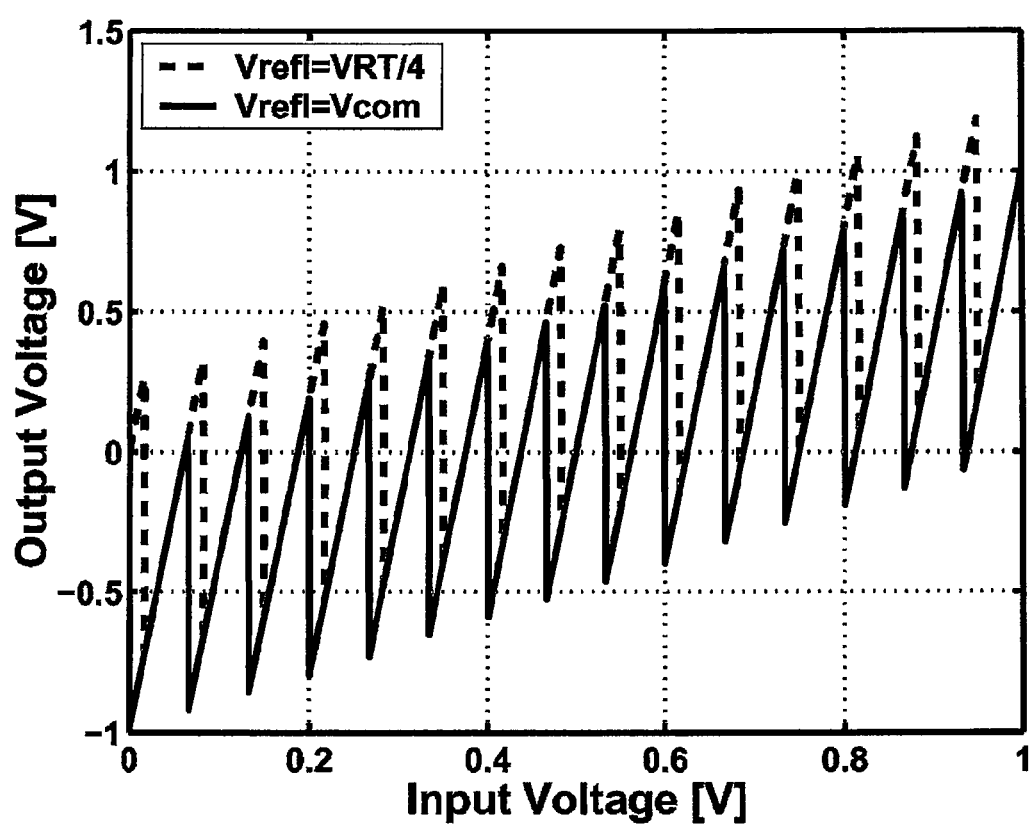
FIG. 5 is a drawing illustrating the input/output characteristics of a gain stage determined through simulation.

FIG. 5 is a drawing illustrating the input/output characteristics during operation of an integration A/D converter of a gain stage obtained through simulation. During the integration A/D conversion (number of integrations is performed: 16 times), the simulation result using two different values of the reference value Vref1 is shown in FIG. 5. When the comparator of the A/D converter circuit uses a reference voltage (for example, 0.25 volts) for cyclic A/D conversion as a reference voltage for integration A/D conversion, the full range of the output voltage exceeds one volt (supply voltage). Therefore, it is preferred to use a reference voltage for integration A/D conversion that has a value smaller than that of the reference voltage for cyclic A/D conversion. In this simulation, a reference voltage V$_{COM}$ of, for example, 0 volts is used. As is apparent from FIG. 5, integration A/D conversion can be performed in a wide range from low luminance to high luminance. At low luminance, the S/N ratio is improved while a wide dynamic range is obtained. Through 16 integration operations and 11 cyclic A/D conversion operations, a 4-bit digital code is generated through integration A/D conversion, and a 12-bit digital code is generated from the 1.5-bit cyclic A/D conversion. As a result, a 16-bit digital code is generated. The actual S/N ratio is determined by the noise level. Estimation conducted by the Inventor suggests approximately 14-bit A/D conversion.

The A/D converter according to this embodiment may have a fully differential type instead of a single-end type. With reference to FIG. 1 again, an A/D converter having a fully differential structure will be described. In the A/D converter 11a having a fully differential structure, a first end 41a of a third capacitor 41 is connected to an output 21b of the D/A converter circuit 21, and a second end 41b is connected to a non-inverting input 23c via a switch 55. A third switch 43 is connected between the first end 25a of the first capacitor 25 and the first end 41a of the third capacitor 41. A second capacitor circuit 45 is connected between the non-inverting input 23c and an inverting output 23d, and has the same structure as that of the first capacitor circuit 27. In this embodiment, the second capacitor circuit 45 includes a fourth switch 47 and a fourth capacitor 49 connected in series. A third feedback switch 51 is connected between the non-inverting input 23c and the inverting output 23d. The switch 51 operates in response to the clock signal φs, while the fourth switch 47 operates in response to the clock signal φ3. The gain stage 15 of the A/D converter 11a has a complementary output 15c in addition to the output 15b.

The A/D converter 11a also performs integration A/D conversion during the first period T1 and the second period T2. Furthermore, the A/D converter 11a operates in the same manner as the A/D converter of a single-end structure. Thus, this converter performs integration operation by multiple-times sampling for noise cancellation and reduces random noise generated at the amplification transistor and the noise-cancellation circuit in the pixel. The upper-order bits are generated through the A/D conversion to ensure a required dynamic range.

The A/D converter 11a includes the following circuit elements for cyclic A/D conversion in the third period T3. In the gain stage 23, a sixth switch 39 is connected between the second end 25b of the first capacitor 25 and the second end 41b of the third capacitor 41. A fourth feedback switch 53 is connected between the first end 41a of the third capacitor 41 and the inverting output 23d. An eighth switch 55 is connected between the second end 41b of the third capacitor 41 and the non-inverting input 23c. The fourth feedback switch 53 operates in response to a clock signal $\phi 1d$, while the eighth switch 55 operates in response to $\phi 2$.

Figure 6:
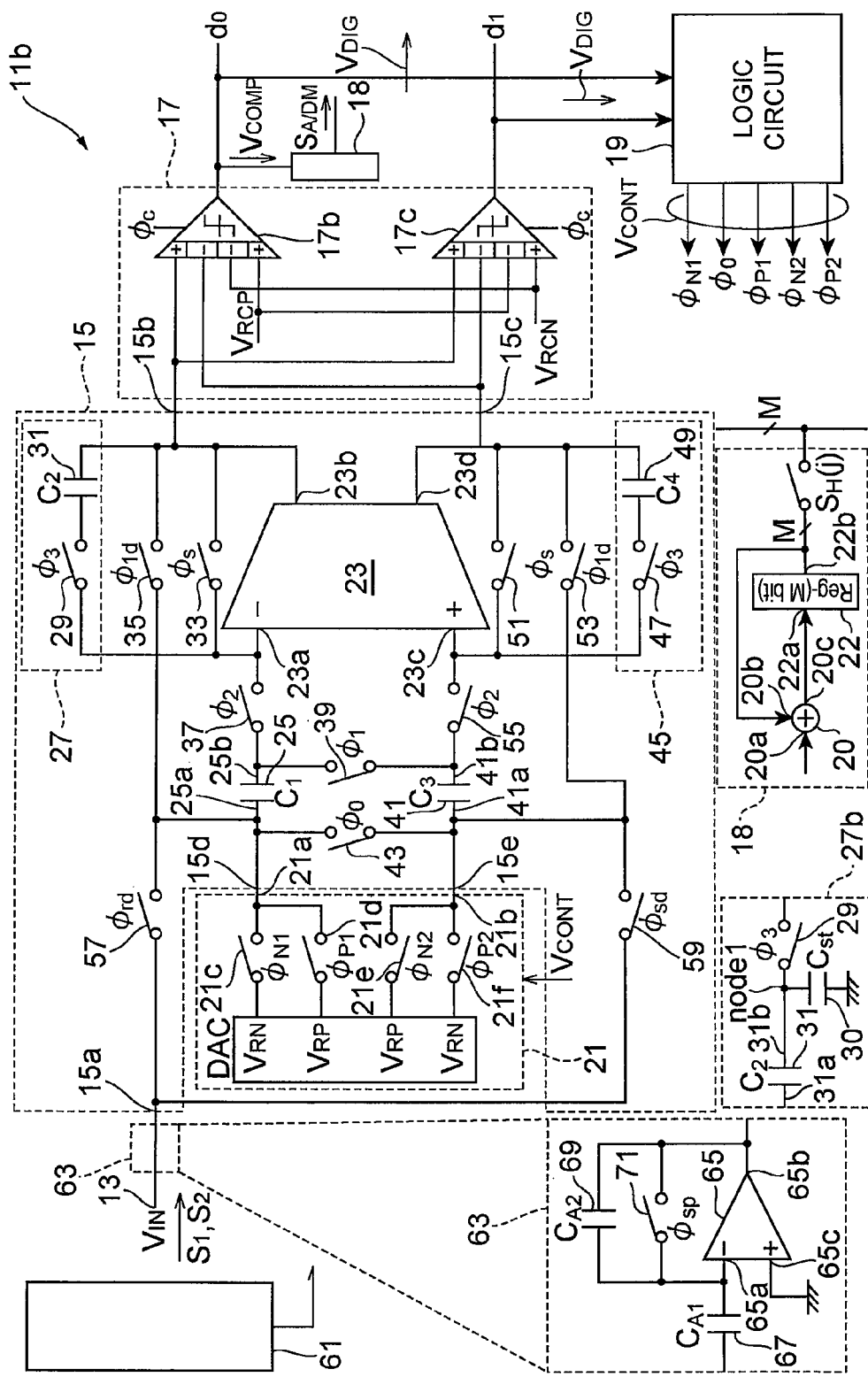
FIG. 6 is a circuit diagram of an A/D converter according to this embodiment.

FIG. 6 is a circuit diagram of an A/D converter according to this embodiment. In this embodiment, an A/D converter 11b is included in a CMOS image sensor, as in the A/D converters 11 and 11a. The A/D converter 11b includes a switch 57 that operates in response to a clock signal $\phi rd$, instead of the switch 24. The A/D converter 11b includes a switch 59 connected between the input 13 and the first end 41a of the third capacitor 41. This switch 59 samples signals from the CMOS image sensor. The switch 59 operates in response to a clock signal $\phi sd$.

Figure 7:
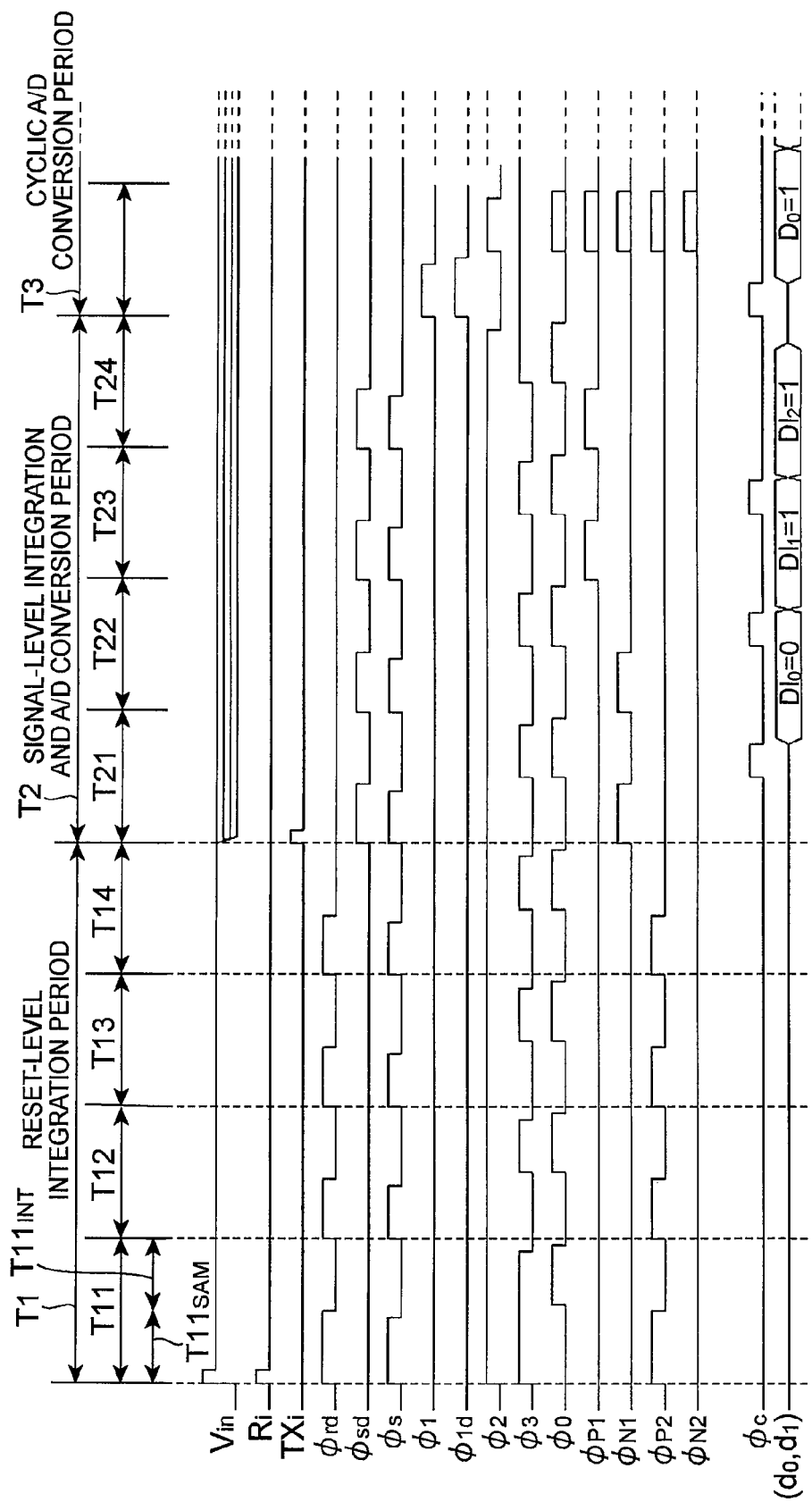
FIG. 7 is a drawing illustrating a timing chart for the operation of the A/D converter.
Figure 8:
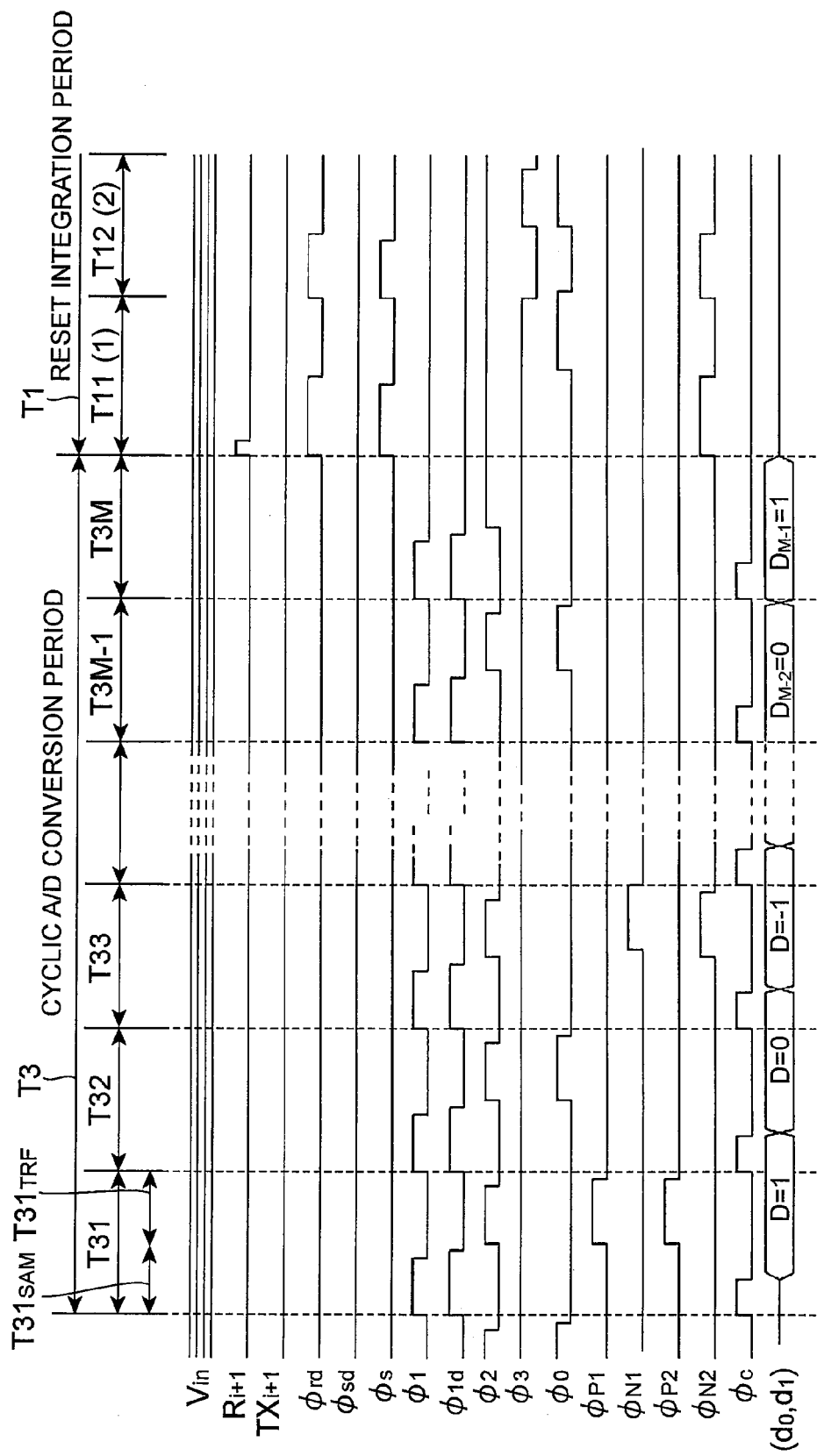
FIG. 8 is a drawing illustrating a timing chart for the operation of the A/D converter.

The noise cancellation operation will now be described. FIGS. 7 and 8 are drawings illustrating timing charts of the operation of an A/D converter. The A/D converter 11b operates according to the timing charts shown in FIGS. 7 and 8. Clock signals required for the operation are provided by a clock signal generator 61. Clock-signal generators similar to the clock-signal generator 61 are used for the A/D converters 11 and 11a. Integration A/D conversion by the A/D converter 11b will be described with reference to FIGS. 7 to 9.

Multiple-times sampling integrates the reset-level signal Vr from a pixel of the CMOS image sensor by use of the gain stage 15.

Figure 9:
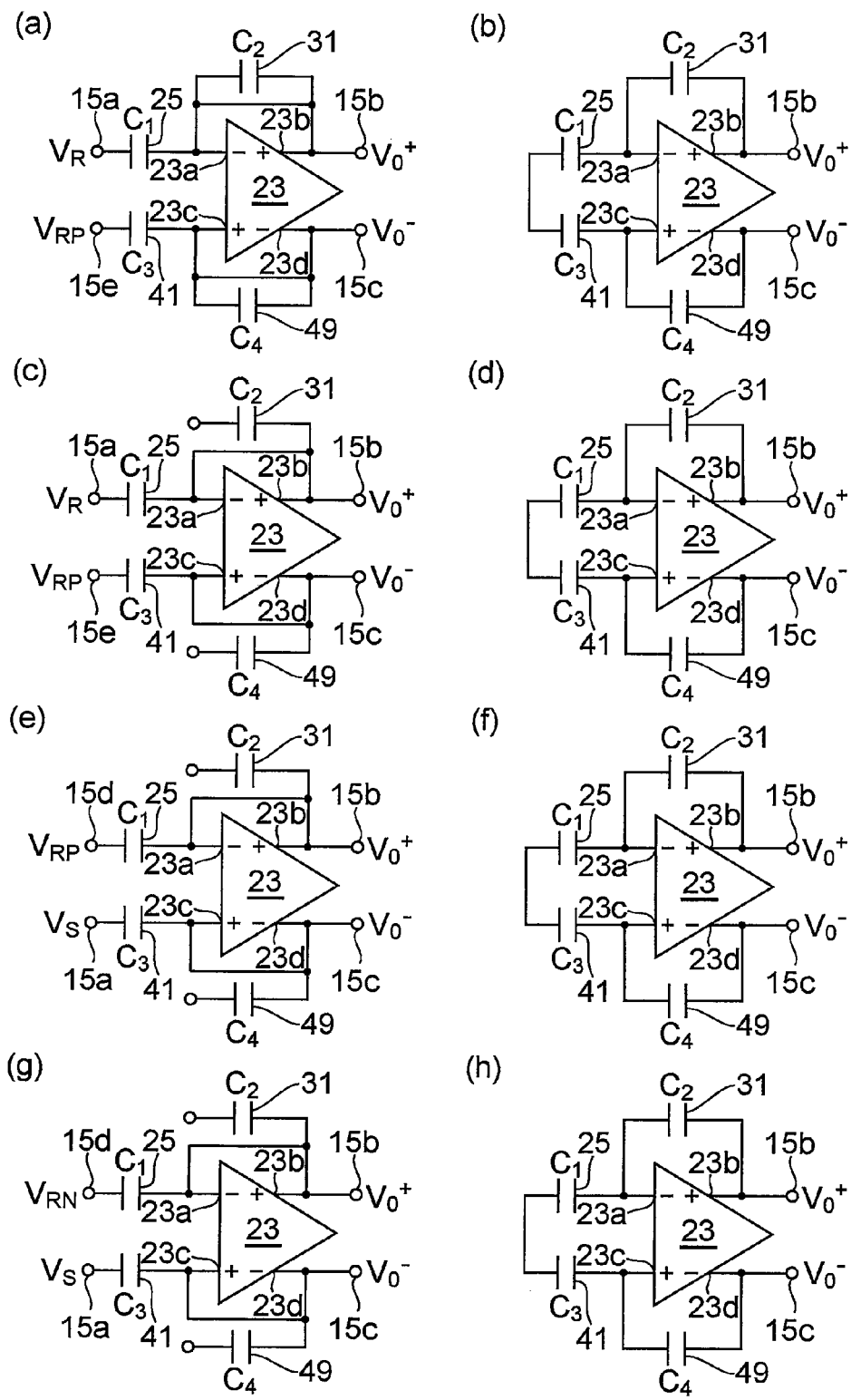
FIG. 9 is a drawing illustrating the operation for integration A/D conversion.

In Step (a) shown in FIG. 9, the reset-level signal Vr is supplied to the input 15a while a predetermined voltage signal $V_{RP}$ from the D/A converter circuit 21 is supplied to an input 15e, and the feedback switches 33 and 51 are turned on to connect the input and the output of the operational amplifier circuit 23. In this way, the electric charges in the capacitors 31 and 49 are reset, and the voltages Vr is sampled in the capacitor 25 while the voltage $V_{RP}$ is sampled in the capacitor 41.

Then, in Step (b) shown in FIG. 9, a first end of the capacitor 25 and a first end of the capacitor 41 are connected through turning on the switch 43 to transfer the voltage sampled in the capacitor 25 to the capacitor 31 and to transfer the voltage sampled in the capacitor 41 to the capacitor 49. In the gain stage 15, $V_O^+$ is generated at the output 15b while $V_O^-$ is generated at the output 15c, acquiring $V_O=V_O^+-V_O^-=Vr \times C_1/C_2-V_{RP} \times C_3/C_4$.

Then, in Step (c) shown in FIG. 9, the reset-level signal Vr is supplied to the input 15a while the voltage signal $V_{RP}$ is supplied to the input 15e. The voltage Vr is sampled in the capacitor 25 while the voltage $V_{RP}$ is sampled in the capacitor 41 through turning off the switches 29 and 47 so that the electric charges in the capacitors 31 and 49 are not reset and through connecting the input and the output of the operational amplifier circuit with each other 23 through turning on the feedback switches 33 and 51.

Then, in Step (d) shown in FIG. 9, a first end of the capacitor 25 and a first end of the capacitor 41 are connected through turning on the switches 29 and 47 and the switch 43 to transfer the voltage sampled in the capacitor 25 to the capacitor 31 and to transfer the voltage sampled in the capacitor 41 to the capacitor 49. In the gain stage 15, $V_O^+$ is generated at the output 15b while $V_O^-$ is generated at the output 15c, thereby obtaining the following:

$$V_O=V_O^+-V_O^-=(Vr \times C_1/C_2-V_{RP} \times C_3/C_4) \times 2.$$

Steps (c) and (d) are repeated. Through N-times repetition, in the gain stage 15, $V_O^+$ is generated at the output 15b while $V_O^-$ is generated at the output 15c, thereby obtaining $V_O=V_O^+-V_O^-=(Vr \times C_1/C_2-V_{RP} \times C_3/C_4) \times N$.

Subsequently, sampling and integration of the signal-level voltage is performed. First, the comparator 17b compares the output voltage of the gain stage 15 with the reference VrafI. When the output voltage is smaller than VrafI, the operations in Steps (e) and (f) are carried out. When the output voltage is larger than or equal to VrafI, the operations in Steps (g) and (h) are carried out. In the sampling of the signal-level voltage, it should be noted that the input polarity of the gain stage 15 is inverted. In Step (e) shown in FIG. 9, the voltage signal $V_{RP}$ is supplied to the input 15a while the signal-level signal Vs is supplied to the input 15e. The voltage $V_{RP}$ is sampled in the capacitor 25 while the voltage Vs is sampled in the capacitor 41 through turning off the switches 29 and 47 so that the electric charges in the capacitors 31 and 49 are not reset and through connecting the input and the output of the operational amplifier circuit 23 with each other by turning on the feedback switches 33 and 51.

Then, in Step (f) shown in FIG. 9, a first end of the capacitor 25 and a first end of the capacitor 41 are connected through turning on the switches 29 and 47 and the switch 43 to transfer the voltage sampled in the capacitor 25 to the capacitor 31 and to transfer the voltage sampled in the capacitor 41 to the capacitor 49. In the gain stage 15, $V_O^+$ is generated at the output 15b while $V_O^-$ is generated at the output 15c. The signals from the outputs of the gain stage 15 are sent to the A/D converter circuit 17. Similar to the operation of the A/D converter having a single end structure, the A/D converter circuit 17 compares the signal from the output of the gain stage 15 with the reference voltage (for example, Vcom) and, in response to the results of comparison, determines the voltage signal to be supplied by the D/A converter circuit 21 in the next step.

In Step (g) shown in FIG. 9, the voltage $V_{RN}$ is sampled in the capacitor 25 and the voltage Vs is sampled in the capacitor 41 through turning off the switches 29 and 47 so that the electric charges in the capacitors 31 and 49 are not reset and through connecting the input and the output of the operational amplifier circuit 23 with each other through turning on the feedback switches 33 and 51.

Then, in Step (h) shown in FIG. 9, a first end of the capacitor 25 and a first end of the capacitor 41 are connected through turning on the switches 29 and 47 and the switch 43 to transfer the electric charge sampled in the capacitor 25 to the capacitor 31 and to transfer the electric charge sampled in the capacitor 41 to the capacitor 49.

The A/D converter circuit 17 compares the signal from the output of the gain stage 15 with the reference voltage (for example, Vcom); in response to the results of comparison, determines the voltage signal to be supplied by the D/A converter circuit 21 in the next step; depending on the results of comparison, selects either the operations in Steps (e) and (f) or the operations in Steps (g) and (h); and repeats the operations in the selected steps. Through N times repetition, in the gain stage 15, $V_O^+$ is generated at the output 15b, and $V_O^-$ is generated at the output 15c. The A/D converter circuit 17 processes the signal from the output of the gain stage 15.

When this processing shows that the signal exceeds the reference voltage by only N1 times, $V_O=V_O^+-V_O^-=N\times(Vr\times C_1/C_2-V_{RP}\times C_3/C_4)+N1\times(V_{RP}\times C_1/C_2-Vs\times C_3/C_4)+N2\times(V_{RN}\times C_1/C_2-Vs\times C_3/C_4)$ is acquired. Here, N=N1+N2 is satisfied, and the D/A converter circuit supplies the voltage $V_{RP}$ during N1 times integration and supplies the voltage $V_{RN}$ during N2 times integration. $V_O=V_O^+-V_O^-=N\times(Vr\times C_1/C_2-Vs\times C_3/C_4)+N1\times(C_1/C_2-C_3/C_4)\times V_{RP}-N2\times(V_{RN}\times C_1/C_2-V_{RN}\times C_3/C_4)$ is acquired. When C1=C2=C3=C4, $V_O=V_O^+-V_O^-=N\times(Vr-Vs)-N2\times(V_{RP}-V_{RN})$ is acquired.

This result demonstrates that the noise-cancellation signal (Vr-Vs) is amplified by N-times through integration. By subtracting the reference voltage difference $(V_{RP}-V_{RN})\times N2$ from the integration signal component $N\times(Vr-Vs)$, the amplified signal can be controlled within a desired voltage range even when the signal from the pixel is amplified by N-times. Through N-times integration, the signal amplitude is amplified to an N-times amplified version, and the amplitude of the random noise is accumulated by sqrt (N). Therefore, the signal to noise ratio (S/N ratio) is improved through the integration operation, resulting in noise reduction. For example, the S/N ratio is improved by approximately four times through 16 times integration. In other words, the noise is relatively reduced to 0.25 times.

Value N2 represents a higher-order digital code. Cyclic A/D conversion, which is described below, of the residual signal from the gain stage 15 yields a lower-order digital code with a high resolution.

Figure 10:
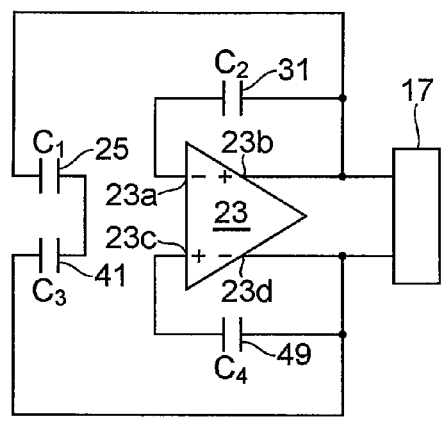
FIG. 10 is a drawing illustrating the operation for cyclic A/D conversion.
Figure 10:
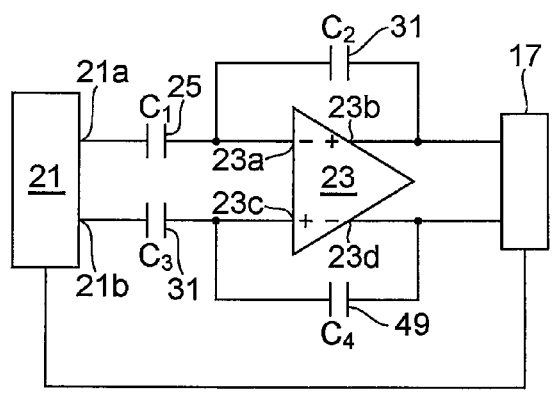

FIG. 10 is a drawing illustrating the operation of a cyclic A/D converter. In Step (a) shown in FIG. 10, the residual signal of the gain stage 15 is sampled in the capacitors 25 and 41 through turning on the feedback switches 35 and 53. Then, in Step (a) shown in FIG. 10, the D/A converter circuit 21 applies a voltage corresponding to the control signal $V_{CONT}$ to the capacitors 25 and 41 to transfer the electric charges in the capacitors 25 and 41 to the capacitors 31 and 49 and to rearrange the electric charges. This generates an operation result at the output of the gain stage 15. A digital signal is generated from the output signal of the gain stage 15 using the A/D converter circuit 17. Steps (a) and (b) are repeated to perform cyclic A/D conversion of a desired number of bits.

As shown in FIGS. 1 and 6, the A/D converters 11, 11a, and 11b according to the first embodiment and a second embodiment may include the capacitor circuit 27b in place of the capacitor circuits 27 and 45.

When the capacitor circuit 27b is used in place of the capacitor circuit 27, a first end 31a of the second capacitor 31 is connected to the inverting input 23a. The second switch 29 is connected between a second end 31b of the second capacitor 31 and the non-inverting output 23b. It is preferred that the capacitor circuit 27b include a capacitor 30 (capacitance Cst) connected to a first node 1 that is connected between the second end 31b of the second capacitor 31 and the second switch 29. The capacitor 30 can reduce noise generated in the switching of the second switch 29 (for example, the voltage-dependent charge injection noise at a MOS analog switch used as the second switch 29).

When the capacitor circuit 27b is used in place of the capacitor circuit 45, the first end 31a of the second capacitor 31 is connected to the non-inverting input 23c. The second switch 29 is connected between the second end 31b of the second capacitor 31 and the inverting output 23d. Similarly, the capacitor circuit 27b including the capacitor 30 can reduce the voltage-dependent charge injection noise.

The A/D converters 11, 11a, and 11b according to the first and second embodiments may include a preamplifier 63. The preamplifier 63 is connected between the pixel 2a of the CMOS image sensor and the input 15a of the gain stage 15.

The preamplifier 63 includes an operational amplifier circuit 65; a first capacitor 67 connected to an inverting input 65a of the operational amplifier circuit 65; and a second capacitor 69 and a switch 71 which are connected in parallel between the input 65a and an output 65b of the operational amplifier circuit 65. The preamplifier 63 amplifies the first signal S1 and the second signal S2 by the gain defined by the capacitance ratio $(C_{A1}/C_{A2})$ of the first capacitor 67 and the second capacitor 69. It is effective to arrange a number of preamplifiers 63 in the columns of the image sensor array 2 in parallel to form an array, as shown in FIG. 2. First, a clock signal φsp is activated to turn on the switch 71. The input of the preamplifier 63 receives the reset-level signal Vr from the pixel 2a. This signal is sampled in the capacitor 67 ($C_{A1}$). Subsequently, through turning off the switch 71, the preamplifier 63 generates an output voltage $V_{OUT1}$. Then, the input of the preamplifier 63 receives the signal-level signal Vs from the pixel 2a. At this time, the preamplifier 63 generates an output voltage $V_{OUT2}$.

The output voltage $V_{OUT1}$ is generated by adding noise to a voltage value (DC operating point) $V_{sc}$ by the switch 71 which operates in response to the clock signal φsp, and $V_{sc}$ is provided by the short-circuiting connection of the input and output of the preamplifier 63. The output voltage $V_{OUT1}$ is represented as follows:

$$V_{OUT1}=V_{SC}+Vnf+Vn1 \quad (1)$$

The noise component includes time-varying noise Vn1 and noise (freeze noise) Vnf of a fixed value that is sampled in the capacitor of the preamplifier 63.

The output voltage $V_{OUT2}$ includes the following components:

$$V_{OUT2}=(Vr-Vs)\times C_{A1}/C_{A2}+V_{SC}+Vnf+Vn2 \quad (2)$$

The first term represents the charge moving from the capacitor $C_{A1}$ to the capacitor $C_{A2}$. After the capacitor $C_{A1}$ receives the noise-level signal from the pixel, an electric charge $Q_{A1}$ (n)=$C_{A1}\times$(Vr-Vsc) is stored in the capacitor $C_{A1}$. Then, after the capacitor $C_{A1}$ receives the signal-level signal from the pixel, $Q_{A1}$(s)=$C_{A1}\times$(Vs-Vsc) is stored in the capacitor $C_{A1}$. This difference is transferred to the capacitor $C_{A2}$. The first and third terms correspond to the freeze noise Vnf and the time-varying noise Vn2, respectively.

In other words, the noise components common to both the level Vs and Vr are cancelled out, and the difference (Vr-Vs) is amplified by the ratio of $C_{A1}$ and $C_{A2}$. The amplified signal (Vr-Vs)×$C_{A1}/C_{A2}$ includes superimposed noise components. After integrating the two voltage levels $V_{OUT2}$ and $V_{OUT1}$ through multiple sampling, the operation to generate the difference ($V_{OUT2}-V_{OUT1}$) is performed.

The difference of the voltage levels $V_{OUT2}$ and $V_{OUT1}$ is represented as follows:

$$\Delta V=V_{OUT2}-V_{OUT1}=(Vr-Vs)\times C_{A1}/C_{A2}+Vn2-Vn1 \quad (3)$$

The common components (operating-point voltage of the amplifier and freeze-noise components) included are cancelled out in ΔV. This cancellation is important for reducing noise. Equation (2) indicates that the freeze-noise component remains after noise cancellation (determining the difference between Vr and Vs) of the signal from the pixel. Equation (3) indicates no correlation between the components Vn1 and Vn2 that vary over time. Thus, noise of these components is not reduced.

Thus, the feasibility of noise reduction by generating the difference $V_{OUT2}-V_{OUT1}$ depends on the intensity of the noise. The actual calculation of noise of the preamplifier, which has a high gain due to the large $C_{A1}/C_{A2}$, shows that the noise component Vnc is dominant. The results of calculation were demonstrated by actual measurement, clearly showing that noise can be reduced significantly. The results of the measurement demonstrates that increasing the ratio $C_{A1}/C_{A2}$ can reduce noise by approximately 40% compared with the canceling advantage that corresponds to Equation (2). In this measurement, the ratio $C_{A1}/C_{A2}$ is 20. It is preferred that the ratio $C_{A1}/C_{A2}$ be 8 or more.

Accordingly, the noise components Vn1 and Vn2 in Equation (3) are reduced through N-times integration of $V_{OUT1}$ and $V_{OUT2}$ in the integration A/D conversion. Through integration A/D conversion, the first term $(Vr-Vs) \times C_{A1}/C_{A2}$ of Equation (3) is amplified by N-times, whereas the random noise components (Vn2, Vn1) are accumulated by sqrt (N). Therefore, this N-times integration improves the S/N to sqrt of "N". In other words, the input referred noise is 1/(sqrt (N)), thereby achieving both reduction in freeze noise and readout with significantly low noise. The preamplifier may have a full-differential type or may include an amplifier of a single-ended output instead of the internal operational amplifier.

As described above, the above A/D converter is provided in this embodiment. This A/D converter is particularly suitable for use in image sensor columns which includes the array of A/D converters of the relevant type. The A/D converter has a simple circuit configuration and reads out a signal of the image sensor at low noise while outputting a high-resolution digital value having a wide dynamic range. Accordingly, noise is reduced by performing noise cancellation of the signal from the image sensor pixel, sampling the signal multiple times, and amplifying it through integration. The intermediate results of the integration (integration values) are compared in sequence with a reference value by the comparator. When the comparison result indicates that the integration value is larger than the reference value, a predetermined value is subtracted from the integrated value in order to prevent saturation of the output of the A/D converter, and the number of the subtraction operations can be used as a coarse A/D converted value. The integration A/D conversion is followed by cyclic A/D conversion by use of the circuit used for noise cancellation and integration to perform lower-bit A/D conversion. A high-resolution digital code is obtained through both the integration A/D conversion for upper bits and the cyclic A/D conversion for lower bits. By providing a preamplifier upstream of the integration A/D converter to eliminate freeze noise generated at the preamplifier, thereby making the read-out signal even less noise.

Second Embodiment

Figure 11:
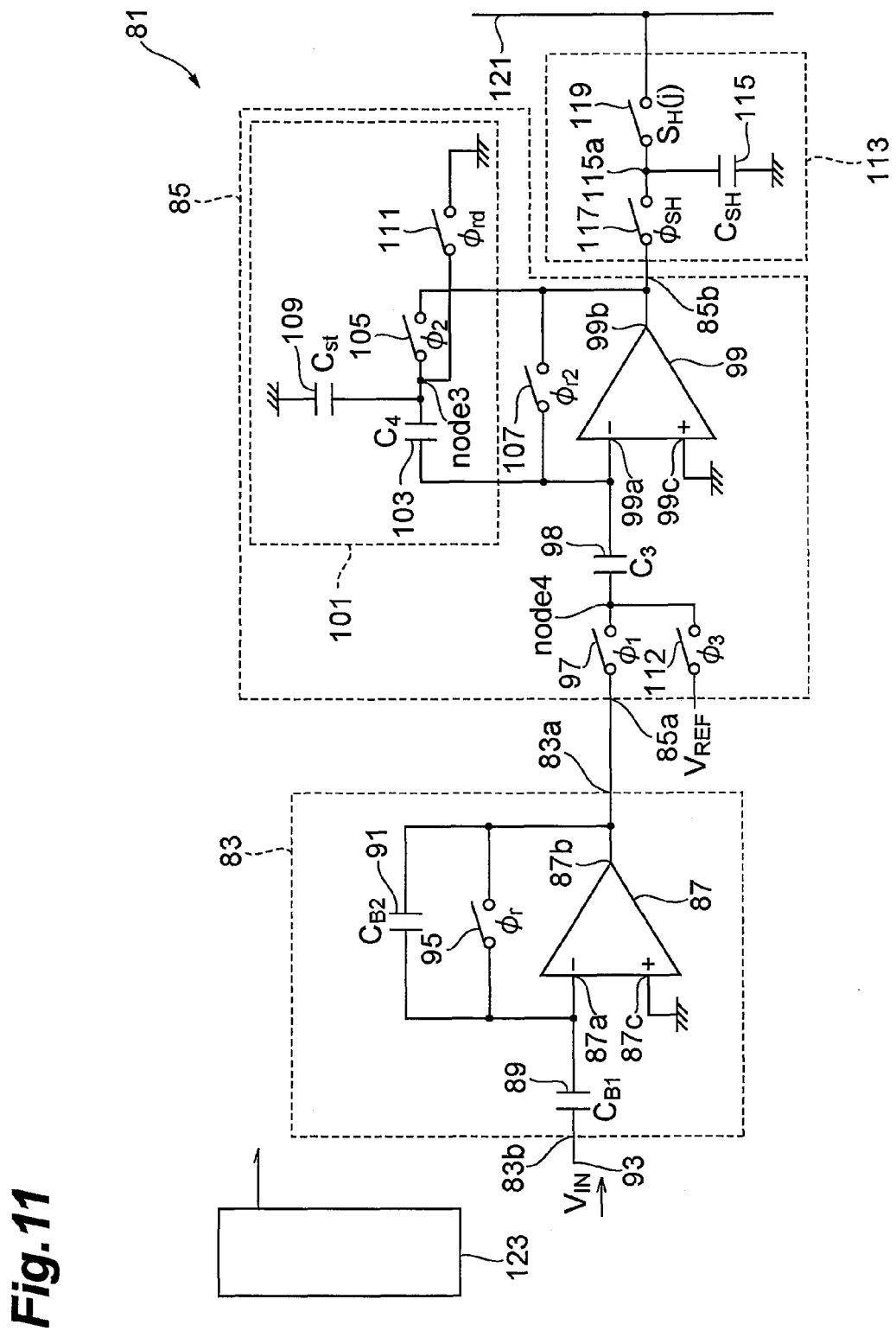
FIG. 11 is a drawing illustrating a readout circuit of an image sensor.
Figure 12:
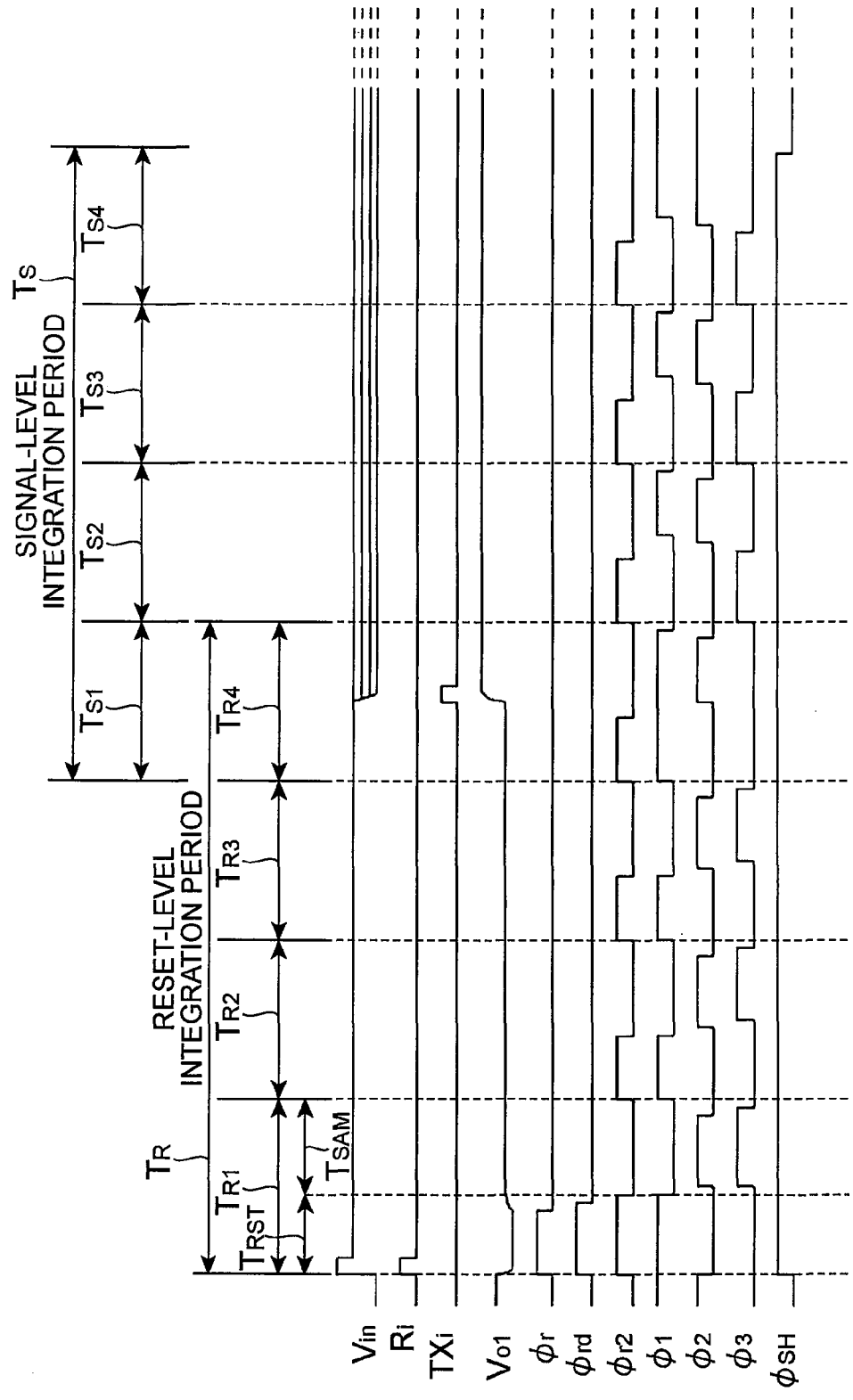
FIG. 12 is a drawing illustrating a timing chart for the readout circuit.
Figure 13:
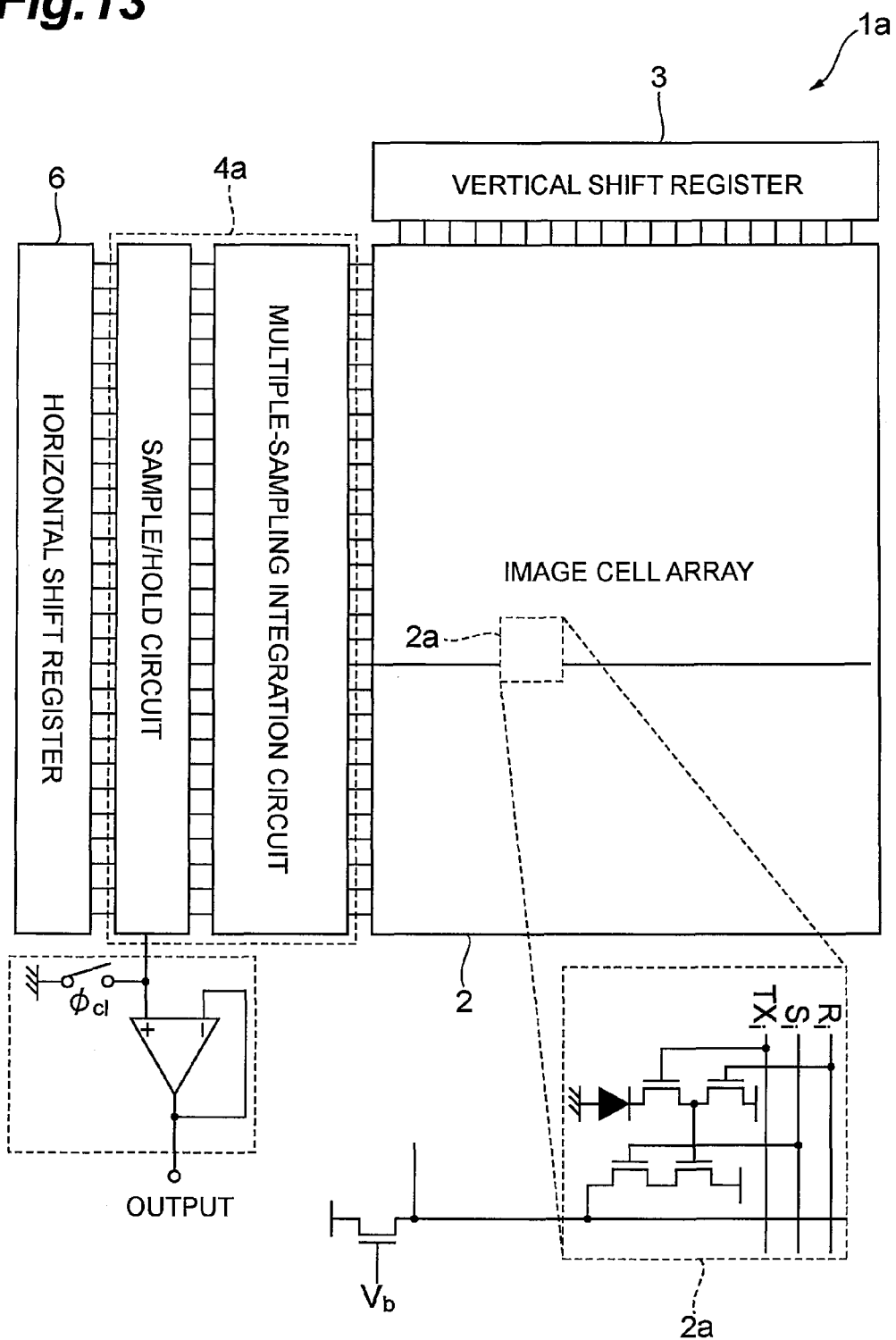
FIG. 13 is a drawing illustrating a CMOS image sensor.

FIG. 11 is a schematic view of a readout circuit for a CMOS image sensor. FIG. 12 is a timing chart for this readout circuit. As described above, a pixel of the CMOS image sensor generates a first signal in a reset state and a second signal in a photo-receiving state. FIG. 13 is a drawing illustrating an image sensor. A readout circuit 81 includes a preamplifier 83 and an integrator 85. The preamplifier 83 includes an operational amplifier circuit 87; a first capacitor 89 connected to an inverting input 87a of the operational amplifier circuit 87; and a second capacitor 91 connected between a non-inverting output 87b and the inverting input 87a of the operational amplifier circuit 87. The preamplifier 83 amplifies a first signal S1 and a second signal S2, which are received at an input 93, depending on the capacitance ratio of the first capacitor 89 and the second capacitor 91. The preamplifier 83 includes a switch 95 connected between the non-inverting output 87b and the inverting input 87a of the operational amplifier circuit 87. The switch 95 responds to a clock signal φr. A non-inverting input 87c of the operational amplifier circuit 87 is connected to a reference potential line, such as a grounding line.

The integrator 85 includes a sampling switch 97 connected to an output 83a of the preamplifier 83. The integrator 85 performs multiple-times integration of the amplified first signal using the sampling switch 97 and multiple-times integration of the amplified second signal using the sampling switch 97 to amplify the difference between the first signal and the second signal. The readout circuit 81 performs multiple-times integration of the amplified first signal, and performs multiple-times integration of the amplified second signal such that the polarity of the input 85a of the integrator 85 is made reversed to that of the output 83a of the preamplifier 83. Accordingly, the integrator 85 provides a signal that is an amplified difference of the first signal S1 and the second signal S2.

Specifically, in the integrator 85, a first capacitor 98 is connected between an inverting input 99a of an operational amplifier circuit 99 and the switch 97. The switch 97 responds to a clock signal φ1. A capacitor circuit 101 is connected between a non-inverting output 99b and the inverting input 99a of the operational amplifier circuit 99. The capacitor circuit 101 includes a second capacitor 103 and a switch 105, which are connected in series. The integrator 85 includes a switch 107, which is connected between the non-inverting output 99b and the inverting input 99a of the operational amplifier circuit 99. The switch 107 responds to a clock signal φr2. The capacitor circuit 101 further includes a reset switch 111 connected to a common node 3 of the second capacitor 103 and the switch 105. The capacitor circuit 101 further includes a capacitor 109 that has a first end connected to the common node 3. A second end of the capacitor 109 is connected to a reference electric-potential line, such as a ground line. The capacitor 109 is useful for reducing the voltage-dependent switching noise caused by the reset switch 111. A switch 112 for supplying a reference voltage $V_{REF}$ is connected to a common node 4 of the first capacitor 98 and the switch 97. The switch 112 responds to a clock signal φ3.

A sample/hold (S/H) circuit 113 is connected to an output 85b of the integrator 85. The S/H circuit 113 includes a holding capacitor 115 and a sampling switch 117 connected between a first end 115a of the holding capacitor 115 and the output 85b of the integrator 85. The held signal is sent to a horizontal scanning line 121 via a synchronization switch 119. The clock signals in the timing chart shown in FIG. 12 are provided by a clock generator 123. A reference electric potential, such as a grounding potential, is supplied to the non-inverting inputs of the operational amplifier circuits 87 and 99. The readout circuit 81 shown in FIG. 11 is single-ended. The readout circuit 81, however, may include a full-differential operational amplifying circuit for the preamplifier and the integrator. An A/D converter may be connected to the output of the integrator 85 to perform, for example, cyclic A/D conversion.

FIG. 13 is a block diagram of an image sensor 1a. The array of the readout circuit 81 is arranged in the columns of a array 2 of image cells. In this arrangement, the readout circuit 81 can read out a signal from the image sensor at low noise with a simple circuit configuration. A procedure for in-pixel electric-charge transfer is employed for a pixel 2a of the image cell array 2. As shown in FIG. 12, the timing chart includes a reset-level integration period $T_R$ and a signal-level integration period $T_S$. In this embodiment, integration is performed during four sub-periods $T_{R1}$ to $T_{R4}$ in the reset-level integration period $T_R$, and during four sub-periods $T_{S1}$ to $T_{S4}$ in the signal-level integration period $T_S$. In particular, in the first half $T_{RST}$ of the sub-period $T_{R1}$ in the reset-level integration period $T_R$, the preamplifier 83 is reset in response to the clock signal φr using the switch 95. Sampling is performed during the second half $T_{SAM}$ of the sub-period $T_{R1}$. In this embodiment, the sub-period $T_{R4}$ of the reset-level integration period $T_R$ is simultaneous with the sub-period $T_{S1}$ of the signal-level integration period $T_S$. Therefore, the switch 97 is turned on in response to the clock signal φ1 mostly throughout the sub-periods $T_{R4}$ and $T_{S1}$. In the signal-level integration period $T_S$, the second signal S2 is provided to the preamplifier 83 in response to a clock signal TXi. The preamplifier 83 samples the amplified second signal S2 in the capacitor 98 via the switch 97 in response to the clock signal φ1. In the sub-period $T_{R4}$ of the reset-level integration period $T_R$ and the sub-period $T_{S1}$ of the signal-level integration period $T_S$, the clock signal φ1 has a long high term. In the reset control signal $T_R$, the clock signal φ1 is active in the first half of each sub-period, whereas, in the signal-level integration period $T_S$, the clock signal φ1 is active in the second half of the sub-period. Therefore, integration in the integrator 85 in the reset-level integration period $T_R$ is performed with reversed polarity relative to that of the integration in the integrator 85 in the reset-level integration period $T_R$.

The first signal (reset-level) S1 of the pixel 2a is sampled in the preamplifier 83 via the output. Then, the reset switch 95 in the preamplifier 83 is turned on to reset the capacitor 91. When the reset switch 95 is open again after the above reset, this reset operation generates noise at the output 83a of the preamplifier 83. The integrator 85 performs multiple-times sampling to integrate the first signal S1.

Then, the second signal (signal level) S2 of the pixel 2a is applied to the preamplifier 83. The preamplifier 83 amplifies this signal by the capacitance ratio of the capacitors 89 and 91 in the preamplifier 83. The integrator 85 generates a signal indicating the difference between the first signal S1 and the second signal S2. At this time, the integrator 85 performs integration through multiple-times sampling such that the polarity of the signal from the output 83a of the preamplifier 83 becomes reversed. As a result of such processing, the output of the integrator provides a signal amplified through integration of the signal indicating difference between the first signal S1 and the second signal S2 from the output 83a of the preamplifier 83. The result of the integration is sampled and stored in the S/H circuit 113 and is sent to an external circuit through the horizontal scanning line 121.

Figure 14:
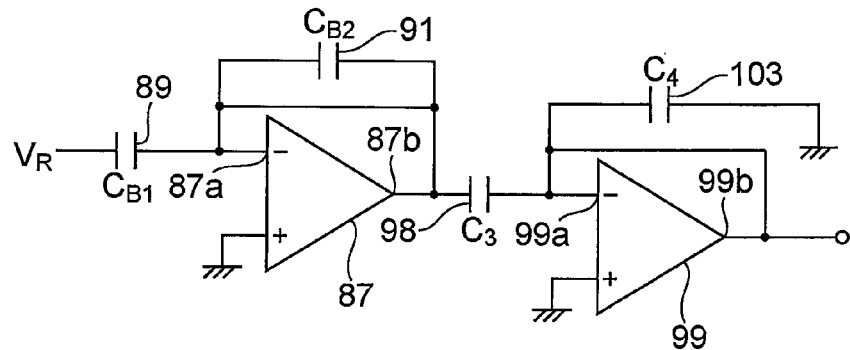
FIG. 14 is a drawing illustrating the operation of a multiple-integration readout circuit.
Figure 14:
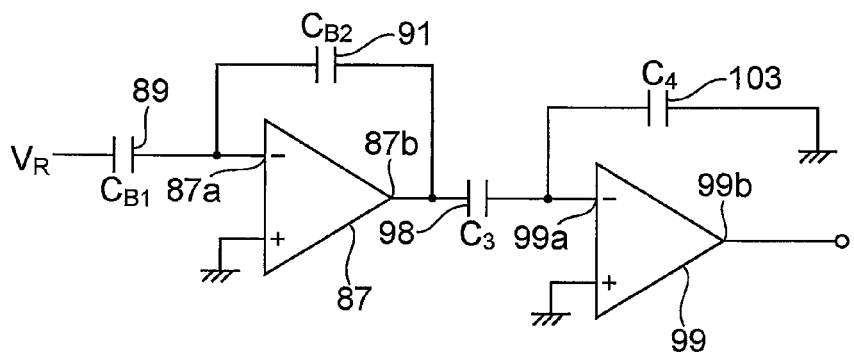
Figure 14:
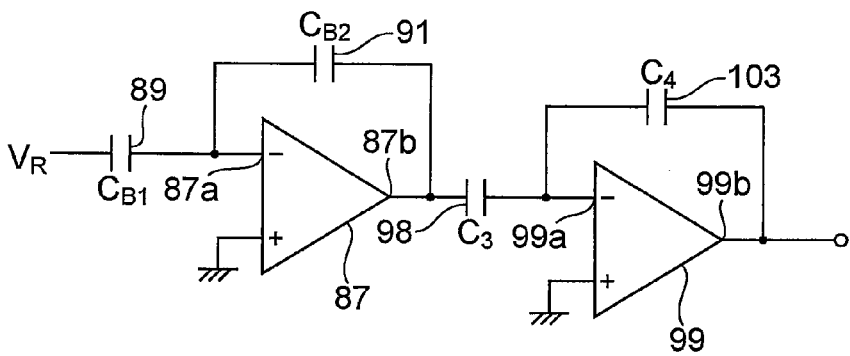
Figure 14:
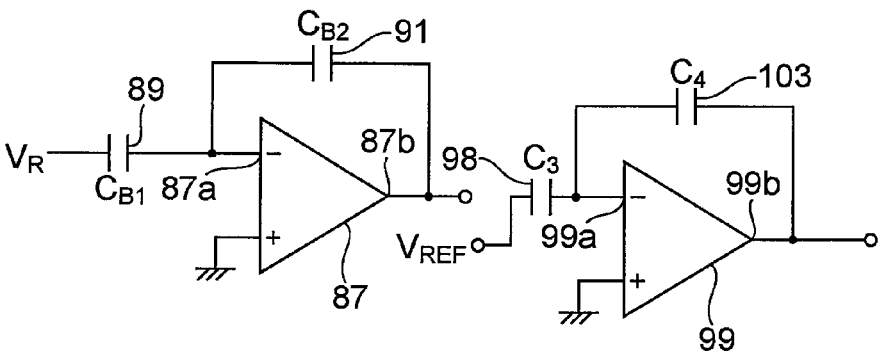
Figure 15:
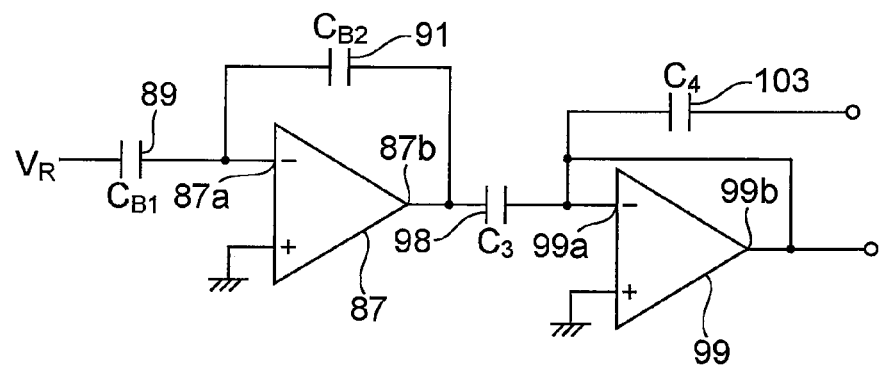
FIG. 15 is a drawing illustrating the operation of a multiple-integration readout circuit.
Figure 15:
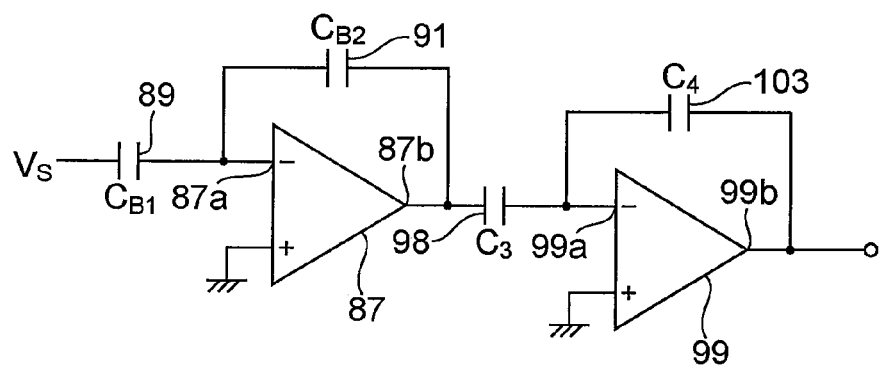
Figure 15:
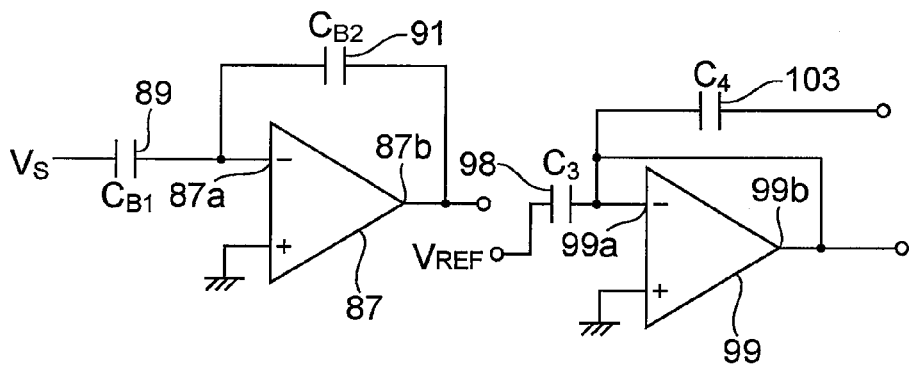

The operation of an image sensor including a multiple-sampling integration circuit will be described. FIGS. 14 and 15 are drawings illustrating the operation of a multiple-integration readout circuit. In the timing chart shown in FIG. 12, sampling is performed four times. In an exemplary operation described below, integration of each of the reset level and the signal level from the pixel 2a is performed two times. Hereinafter, "$V_R$" represents the first signal S1, and "$V_S$" represents the second signal S2.

In Step (a), the reset-level signal $V_R$ of the pixel 2a is applied to an input 83b of the preamplifier 83. The inverting input 87a of the operational amplifier circuit 87 is connected to the non-inverting output 87b via the switch 95 to sample the signal $V_R$ in the capacitor 89. In the integrator 85, the inverting input 99a and the non-inverting output 99b of the operational amplifier circuit 99 are connected through turning on the switch 107, and the switch 111 is turned on in response to the clock signal φrd. In this way, the electric charge in the capacitor 103 is reset. The switch 97 is turned on in response to the switch 97. In this way, the electric charge in the capacitor 98 is reset.

In Step (b), the switch 95 is turned off in response to the clock signal φr, and the switch 107 is turned off in response to the clock signal φr2. Noise components generated at switches and amplifiers are sampled in the capacitor 91 and are provided to the output 83a. The integrator 85 samples the signal from the preamplifier 83 via the switch 97 in the capacitor 98.

In Step (c), the switch 111 in the integrator 85 is turned off while the electric charge in the capacitor 98 is integrated in the capacitor 103 through turning on the switch 105. At this time, a voltage represented by the following equation is provided at the output of the integrator 85:

$$V_O(1)=C_3/C_4 \times Vnd1(1)+C_3/C_4 \times C_{B1}/C_{B2} \times Vnpd(1)$$

Vnd1(1) represents noise components (time-varying noise) in the preamplifier 83, and Vnpd(1) represents noise components (time-varying noise) in a source follower of the pixel 2a. The numerals in the parentheses indicate the order of the steps. The first term represents noise due to the preamplifier 83, while the second term represents noise due to the pixel 2a. These noise components are amplified by the preamplifier 83.

In Step (d), the switch 97 is turned off in response to the clock signal φ1, and the switch 112 is turned on in response to the clock signal φ3. A voltage $V_{REF}$ is supplied to the capacitor 98 in the integrator 85. An electric charge corresponding to this voltage moves from the capacitor 98 to the capacitor 103. At this time, a voltage represented by the following equation is generated at the output of the integrator 85:

$$V_O(1)=C_3/C_4 \times (Vnf1(1)+Vnd1(1)-V_{REF})+C_3/C_4 \times C_{B1}/C_{B2} \times Vnpd(1)$$

where Vnf1(1) represents freeze noise in the preamplifier 83. The freeze noise is present as a fixed electric charge sampled in the capacitor, and does not vary over time.

In Step (e), the switch 105 is turned off in response to the clock signal φ2. Since a first end (a capacitor terminal connected to the output of the integrator) of the capacitor 103 is open, the result of the integration is held in the capacitor 103. The inverting input 99a of the operational amplifier circuit 99 is connected to the non-inverting output 99b through turning on switch 107 in response to the clock signal φr2.

In Step (f), the second signal S2 is supplied to the input 93 of the readout circuit 81. The preamplifier 83 amplifies this second signal S2. The capacitor 98 of the integrator 85 receives the amplified signal. Then, the following voltage is provided at the output of the integrator 85.

$$V_O(1)=C_3/C_4 \times (Vnf1(1)+Vnd1(1)-V_{REF}-Vnd1(3))+C_3/C_4 \times C_{B1}/C_{B2} \times (Vnpd(1)-Vndp(3)+V_R-V_S)$$

In Step (g), the switch 97 is turned off in response to the clock signal φ1 while turning on the switch 112 in response to the clock signal φ3. A voltage $V_{REF}$ is supplied to the capacitor 98 of the integrator 85. An electric charge corresponding to this voltage moves from the capacitor 98 to the capacitor 103. At this time, the voltage represented by the following equation is generated at the output of the integrator 85.

$$V_O(1)=C_3/C_4 \times (Vnf1(1)+Vnd1(1)-V_{REF}-Vnd1(3)-Vnd1(4)-Vnf1(1)+V_{REF})+C_3/C_4 \times C_{B1}/C_{B2} \times (Vnpd(1)-Vnpd(3)-Vnpd(4)+2 \times (V_R-V_S))=C_3/C_4 \times (Vnd1(1)-Vnd1(3)-Vnd1(4))+C_3/C_4 \times C_{B1}/C_{B2} \times (Vnpd(1)-Vnpd(3)-Vnpd(4)+2 \times (V_R-V_S))$$

Through the sequence of these operations, the freeze-noise component Vnf1 in the preamplifier 83 is cancelled out. The input signal ($V_R-V_S$) is amplified by N-times through N-times sampling. Through this integration, the time-varying noise components (Vnpd and Vnd1) are integrated. The time-varying components, however, are uncorrelated and random. Therefore, as a result of the N-times integration, the amplitude of the time-varying components is amplified by square root of (2×N−1), while the signal component ($V_R$−$V_S$) is amplified by N through the N-times integration of the signals $V_R$ and $V_S$.

An increase in the gain of the preamplifier 83 (defined by the capacitor ratio $C_{B1}/C_{B2}$) reduces the time-varying noise component due to the reduction of frequency bandwidth of the preamplifier 83. It is preferred that the ratio $C_{B1}/C_{B2}$ be 8 or more.

These two effects lead to signal readout with significantly low noise. Moreover, 1/f noise is also reduced by the following operations: the multiple-times sampling of each of the signal level and the reset level; and the generation of a signal indicating the difference therebetween.

Figure 16:
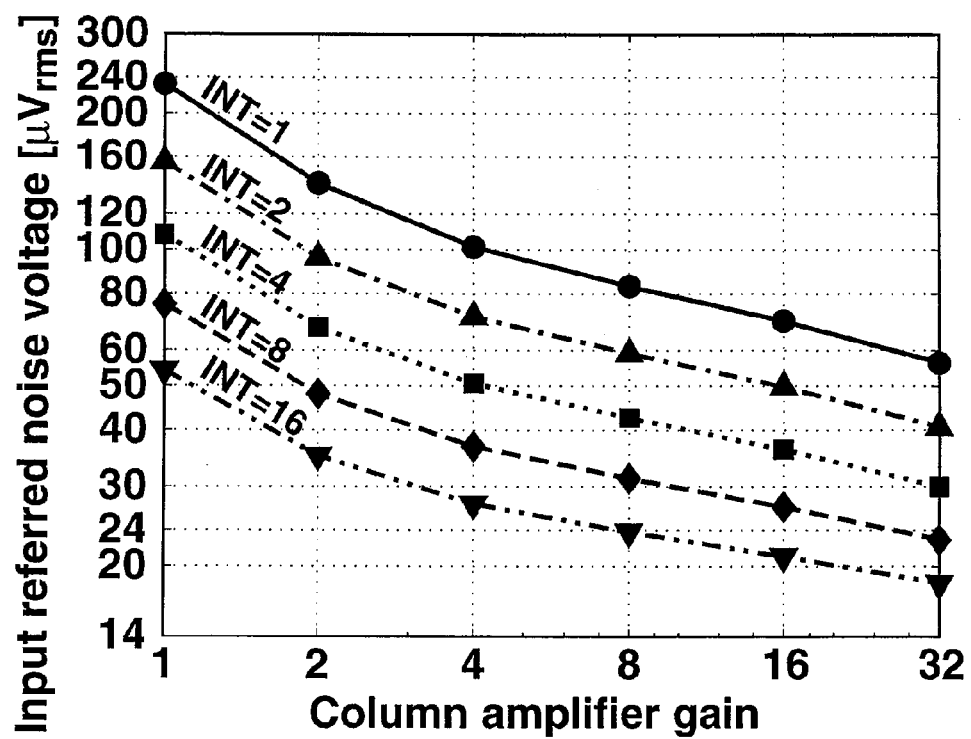
FIG. 16 is a graph illustrating the relationship between the preamplifier gain and the input referred noise.

FIG. 16 is a graph indicating an estimate based on noise analysis. In the drawing, "INT" represents the number of integrations. With reference to FIG. 16, the gain of the preamplifier is 1. If multiple integrations are skipped, the total input referred noise, such as thermal noise and 1/f noise, is 232 μVrms. When the gain of the preamplifier is 32 times, the total noise is reduced to 56.4 μVrms. In the 16 times integration and a pre-amplification of 32-fold gain, the total noise is reduced to 18.4 μVrms. The conversion gain is estimated to be 60 μV/e⁻, which corresponds to 0.3 or smaller in the number of equivalent-noise electrons. By reducing the noise to 0.3 or smaller in terms of the number of equivalent electrons, the discrete level generated depending on the signal electron number can be roughly determined.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

The invention claimed is:

1. An A/D converter for an image sensor, comprising:
   a gain stage having an output and an input for receiving a signal from the image sensor, the gain stage performing multiple-times sampling of a first signal from a pixel of the image sensor and integration of sampled values in a first period and performing multiple-times sampling of a second signal from the pixel and integration of sampled values in a second period with reversed polarity relative to the integration of the first signal, the first signal containing a component associated with noise, the second signal containing a photo-induced signal component and the component associated with noise, and the gain stage including a first capacitor for the sampling, a second capacitor for the integration, and an operational amplifier circuit for performing sampling of a signal in the first capacitor and integration of the sampled signal by use of the second capacitor;
   an A/D converter circuit providing a digital signal, the digital signal having one of first and second values in accordance with a signal from the output of the gain stage;
   a circuit providing a signal, the signal representing the number of times the first value appears;
   a logic circuit generating a control signal in response to the digital signal; and
   a D/A converter circuit providing a predetermined voltage signal to the gain stage in the first period while providing a voltage signal to the gain stage in the second period, the voltage signal corresponding to the control signal.

2. The A/D converter according to claim 1, wherein, the first capacitor has a first end connected to the D/A converter circuit and a second end connected to an inverting input of the operational amplifier circuit, the gain stage further comprises:
   a first capacitor circuit connected between the inverting input and a non-inverting output of the operational amplifier circuit,
   a first switch, connected between the input and the first end of the first capacitor, for sampling the signal from the image sensor, and
   a first feedback switch connected between the inverting input and the non-inverting output, and
   the first capacitor circuit includes the second capacitor and a second switch, and the second capacitor and the second switch are connected in series.

3. The A/D converter according to claim 1, wherein the gain stage performs cyclic A/D conversion in a third period after the first and second periods by use of the voltage signal provided by the D/A converter circuit in accordance with the signal from the output of the gain stage.

4. The A/D converter according to claim 3, wherein,
   the A/D converter circuit receives the signal from the output of the gain stage and generates a ternary digital signal for cyclic A/D conversion in the third period, and
   the gain stage further comprises:
   another feedback switch connected between the non-inverting output and the first end of the first capacitor; and
   a transfer switch connected between the inverting input and the second end of the first capacitor.

5. The A/D converter according to claim 3, wherein the A/D converter circuit comprises a comparator, the comparator compares the signal from the output of the gain stage with a first reference signal and a second reference signal, the comparator receives the first reference signal in the second period, and the comparator receives the second reference signal in the third period.

6. The A/D converter according to claim 5, wherein a value of the second reference signal is smaller than a value of the first reference signal.

7. The A/D converter according to any one of claims 1 to 6,
   wherein the first capacitor receives the first and second signals for the sampling,
   the gain stage integrates the first signal in the second capacitor by use of the operational amplifier circuit in response to one of providing a signal from the D/A converter circuit and sampling in the first capacitor, and
   the gain stage integrates the second signal in the second capacitor by use of the operational amplifier circuit in response to another of providing a signal from the D/A converter circuit and sampling in the first capacitor.

8. The A/D converter according to claim 1,
   wherein the gain stage further comprises a third capacitor for the sampling and a fourth capacitor for the integration,
   one of the first capacitor and the third capacitor receives the first signal for the sampling to create a first sampled signal,
   another of the first capacitor and the third capacitor receives the second signal for the sampling to create a second sampled signal, and
   the operational amplifier circuit integrates the first and second sampled signals into the second capacitor and the fourth capacitor in response to the signal from the D/A converter circuit, respectively.

9. The A/D converter according to claim 8,
   wherein the third capacitor has a first end connected to the D/A converter circuit and a second end connected to the non-inverting input, the gain stage further comprises:
a third switch connected between the first end of the first capacitor and the first end of the third capacitor,
a second capacitor circuit, connected between a non-inverting input of the operational amplifier circuit and an inverting output of the operational amplifier circuit, including the fourth capacitor and a fourth switch,
a second feedback switch connected between the non-inverting input and the inverting output, and
a fifth switch, connected to the input and the first end of the third capacitor, for sampling the signal from the image sensor, and
the fourth capacitor and the fourth switch are connected in series.

10. The A/D converter according to claim 2,
wherein the gain stage further comprises:
a third capacitor having a first end connected to the D/A converter circuit and a second end connected to a non-inverting input of the operational amplifier circuit,
a third switch connected between the first end of the first capacitor and the first end of the third capacitor,
a second capacitor circuit including a fourth capacitor and a fourth switch, the fourth capacitor and the fourth switch being connected in series, and the second capacitor circuit being connected between the non-inverting input and an inverting output of the operational amplifier circuit, and
a second feedback switch connected between the non-inverting circuit and the inverting output.

11. The A/D converter according to claim 10,
wherein the gain stage performs cyclic A/D conversion in a third period after the first and second periods, and the A/D converter circuit receives the signal from the output of the gain stage and generates a ternary digital signal in the third period, and
the gain stage further comprises:
a sixth switch connected between the second end of the first capacitor and the second end of the third capacitor,
a third feedback switch connected between the first end of the first capacitor and the non-inverting output,
a fourth feedback switch connected between the first end of the third capacitor and the inverting output,
a first transfer switch connected between the second end of the first capacitor and the inverting input, and
a second transfer switch connected between the second end of the third capacitor and the non-inverting input.

12. The A/D converter according to claim 1,
wherein, in the first capacitor circuit, the first end of the second capacitor is connected to the inverting input, the second switch is connected between the non-inverting output and the second end of the second capacitor, the first capacitor circuit includes a fifth capacitor connected to a first node, and the first node is connected to the second switch and the second end of the second capacitor.

13. The A/D converter according to claim 1,
wherein the pixel is a CMOS image sensor pixel prepared for a CMOS image sensor, the CMOS image sensor pixel provides the first signal when a floating diffusion layer of the CMOS image sensor pixel is in a reset state, and the CMOS image sensor pixel provides the second signal when the floating diffusion layer is in a photo-induced-electric-charge accumulation state provided after the reset state.

14. The A/D converter according to claim 1, further comprising a preamplifier connected between a pixel of the image sensor and the input of the gain stage, the preamplifier providing the first signal and the second signal, the preamplifier including an operational amplifier circuit, a first capacitor connected to an input of the operational amplifier circuit, a second capacitor connected between an output of the operational amplifier circuit and the input of the operational amplifier, and a switch connected between the output and input of the operational amplifier, the preamplifier amplifying the first and second signals, a gain of the preamplifier being defined as a capacitance ratio of the first capacitor and the second capacitor of the preamplifier, the first signal containing a component associated with noise of the preamplifier, and the second signal containing a difference component in addition to the components associated with noise of the preamplifier, and the difference component indicating a difference between a signal provided from the pixel in the reset state and a signal provided from the pixel in the photo-induced-electric-charge accumulation state after the reset state.

* * * * *

UNITED STATES PATENT AND TRADEMARK OFFICE
CERTIFICATE OF CORRECTION

PATENT NO.        : 8,553,112 B2
APPLICATION NO.   : 12/375879
DATED             : October 8, 2013
INVENTOR(S)       : Shoji Kawahito Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1206 days.

Signed and Sealed this
Fifteenth Day of September, 2015

Michelle K. Lee
*Director of the United States Patent and Trademark Office*